US012787416B2

(12) United States Patent
Yu et al.

(10) Patent No.: US 12,787,416 B2
(45) Date of Patent: Nov. 3, 2026

(54) IMAGE SENSOR GATE STRUCTURE AND DOPING PROFILE

(71) Applicant: Taiwan Semiconductor Manufacturing Company, Ltd., Hsinchu (TW)

(72) Inventors: Chih-Kuan Yu, Zhushan Township (TW); Shen-Hui Hong, Tainan City (TW); Feng-Chi Hung, Chu-Bei City (TW); Wen-I Hsu, Tainan City (TW); Jen-Cheng Liu, Hsin-Chu City (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 855 days.

(21) Appl. No.: 17/847,450

(22) Filed: Jun. 23, 2022

(65) Prior Publication Data

US 2023/0420464 A1 Dec. 28, 2023

(51) Int. Cl.
*H10D 84/03* (2025.01)
*H10D 84/01* (2026.01)

(52) U.S. Cl.
CPC ....... *H10D 84/038* (2025.01); *H10D 84/0123* (2025.01)

(58) Field of Classification Search
CPC .............. H10D 84/038; H10D 84/0123; H01L 2924/1306; H10F 39/18; H10F 39/014; H10F 39/802; H10F 39/80373
See application file for complete search history.

(56) References Cited

U.S. PATENT DOCUMENTS 6,074,903 A * 6/2000 Rengarajan ....... H01L 21/76237 438/424
6,777,293 B1 * 8/2004 Koscielniak ......... H10D 64/513 438/242
2010/0244156 A1 * 9/2010 Pal ....................... H10D 64/021 257/288

(Continued)

OTHER PUBLICATIONS

Stefanov, Konstantin D.; Zhang, Zhige; Damerell, Chris; Burt, David and Kar-Roy, Arjun (2013). Performance of buried channel n-type MOSFETs in 0.18-m CMOS image sensor process. In: UV, X-Ray, and Gamma-Ray Space Instrumentation for Astronomy XVIII, SPIE, article No. 8859-17. Published in 2013.

*Primary Examiner* — Duy T Nguyen
*Assistant Examiner* — Zhijun Xu
(74) *Attorney, Agent, or Firm* — Eschweiler & Potashnik, LLC

(57) ABSTRACT

The present disclosure relates to semiconductor device with a multi-gate structure. The semiconductor device includes a substrate and a doped region disposed within the substrate. A gate electrode is disposed over the doped region, and a source region and a drain region are disposed within the doped region. A shallow trench isolation (STI) structure is disposed within the substrate and laterally surrounds the source region and the drain region. A first doped liner is disposed along the STI structure, where the first doped liner separates the STI structure from the source region and the drain region. A second doped liner is disposed along the STI structure, where the second doped liner is separated from the first doped liner by the STI structure above a bottom surface of the STI structure.

20 Claims, 18 Drawing Sheets

(56) References Cited

U.S. PATENT DOCUMENTS

| | | | | |
|---|---|---|---|---|
| 2013/0082312 | A1 | 4/2013 | Hung et al. | |
| 2013/0234202 | A1* | 9/2013 | JangJian | H10F 39/807 438/94 |
| 2013/0334595 | A1* | 12/2013 | Liaw | H10D 62/115 438/270 |

* cited by examiner

IMAGE SENSOR GATE STRUCTURE AND DOPING PROFILE

BACKGROUND

Modern day integrated chips comprise millions or billions of semiconductor devices formed on a semiconductor substrate (e.g., silicon). Integrated chips (ICs) may use many different types of semiconductor devices, depending on an application of an IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
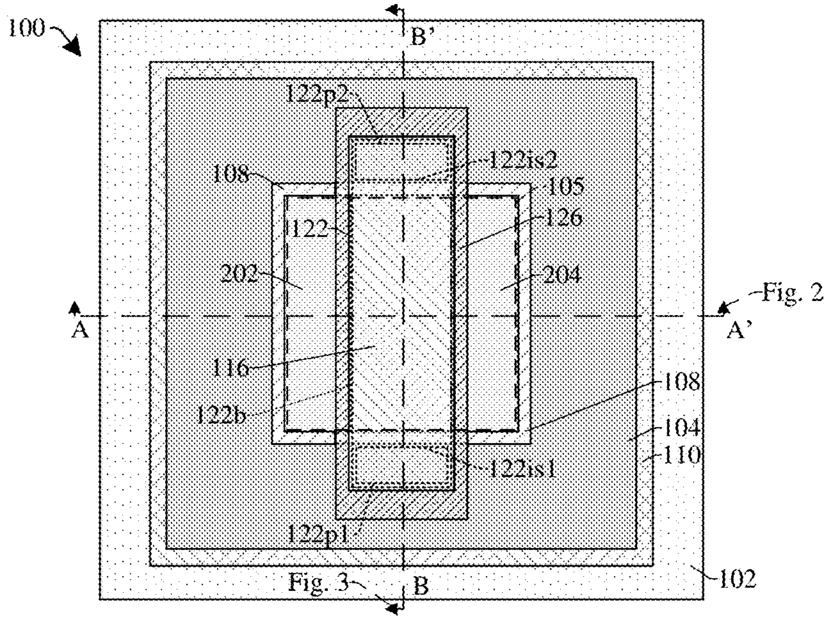
FIG. 1 illustrates a top view of some embodiments of a semiconductor structure including a transistor with a first doped liner and a second doped liner.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Further, source/drain region(s) may refer to a source or a drain, individually or collectively dependent upon the context.

Complementary metal-oxide semiconductor (CMOS) image sensors (CIS) make use of pixel transistors. As CIS resolution increases (e.g., >100 megapixels), transistors used in CIS are scaled down. When transistors are scaled down for CIS applications, random telegraph signal (RTS) noise in the CIS can increase. For example, as a gate width and gate length of the transistor decrease, the RTS noise can increase. Furthermore, dark current leakage can occur from defects caused by etching a semiconductor substrate comprising transistors for a high resolution CIS.

In some aspects, a transistor comprises a source region and a drain region that are spaced apart from one another by a channel region, wherein a gate electrode extends over the channel region. While planar gate electrodes are generally used in CIS applications, planar gate electrodes are in some cases reaching minimal dimensions achievable by lithography, so further scaling is difficult. One option to continue scaling is to use a so-called "multi-gate transistor". In a multi-gate transistor, the gate electrode of the transistor has an inverted u-shape, omega-shape, or other-shaped cross-sectional profile that partially laterally surrounds sidewalls of the channel region, thereby effectively providing a transistor that has the same drive current as a wider planar gate transistor but in a smaller footprint. Multi-gate transistors are still susceptible to dark current leakage and other noise, however. As has been appreciated in some aspects of the present disclosure, when such a multi-gate transistor is arranged within a shallow trench isolation (STI) structure, a doped liner can help reduce noise. However, the gate profile and doped liner crowd the available space of the channel region under the gate electrode. As a result, the channel region may be too small and may not be effectively induced during CIS operation.

Accordingly, in some embodiments, the present disclosure provides a multi-gate transistor disposed within an STI structure. In particular, a first doped liner is disposed on inner sidewalls of the STI structure, and a second doped liner which is thicker than the first doped liner is disposed on outer sidewalls of the STI structure. Compared to other approaches where a doped liner has a uniform thickness over inner and outer sidewalls of an STI structure, using a thinner doped liner on inner sidewalls of the STI structure results in a channel region that reduces noise and still provides an effective channel region during operation.

Figure 2:
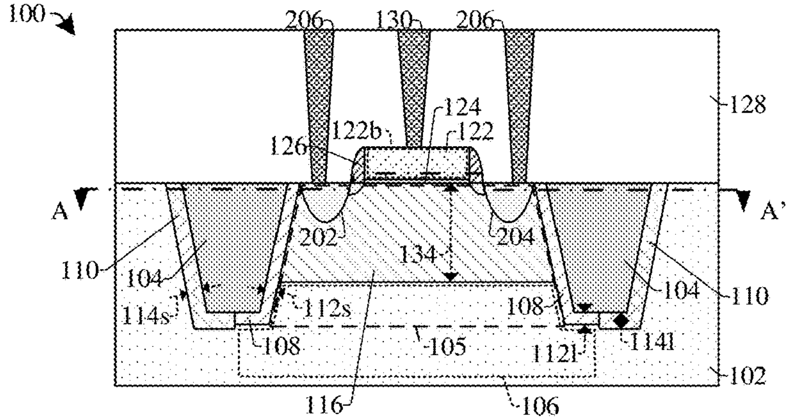
FIG. 2 illustrates a cross-sectional view of some embodiments of a semiconductor structure taken along line A-A' of FIG. 1.
Figure 3:
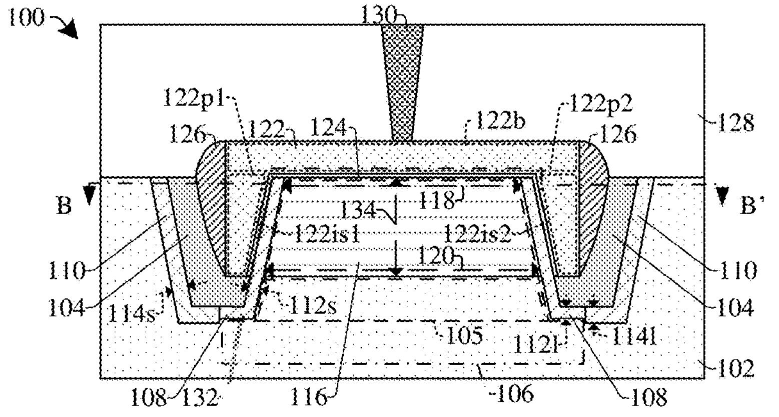
FIG. 3 illustrates a cross-sectional view of some embodiments of a semiconductor structure taken along line B-B' of FIG. 1.

FIG. 1 illustrates a top view of a transistor 100 in accordance with some embodiments, and FIG. 2 and FIG. 3 illustrate cross-sectional views of the transistor 100 along lines A-A' and B-B', respectively of FIG. 1. Notably, while the cross-sectional views of FIGS. 2-3 depict a dielectric layer 128 over the transistor 100, this dielectric layer 128 has been removed from FIG. 1's top view for ease of viewing.

Referring now to FIGS. 1-3 concurrently, one can see the transistor 100 is disposed on a substrate 102. An active area 105 is included in the substrate 102 and is laterally surrounded by a shallow trench isolation (STI) structure 104. Thus, inner sidewalls of the STI structure 104 define the active area 105. In some embodiments, the active area 105 is referred to as an area. In some cases, the substrate 102 comprises monocrystalline silicon and the STI structure 104 comprises insulating material that extends into an upper surface of the substrate 102.

A source region 202 and a drain region 204 are disposed in the substrate 102 within the active area 105. The source region 202 and the drain region 204 are separated from one another in a first direction along a line (e.g., corresponding to line A-A'). A doped region 116 is disposed on the line within the active area 105 and is disposed between the source region 202 and the drain region 204. A buried channel region 106 extends under the doped region 116 and past a lower surface of the STI structure 104.

A gate electrode 122 is disposed over the substrate 102 and above the doped region 116. A gate dielectric 124 separates the gate electrode 122 from the doped region 116. The gate electrode 122 includes a gate body **122*b* that extends laterally (e.g., horizontally) in the first direction between nearest neighboring edges of the source region 202 and the drain region 204. The gate body 122*b* also extends outwardly in a second direction (e.g., corresponding to line B-B') perpendicular to the first direction beyond outer edges of the doped region 116. As can be seen in FIG. 1 and FIG. 3, the gate electrode 122 includes a first gate protrusion 122*p*1 and a second gate protrusion 122*p*2 that extend downward from outer edges of the gate body 122*b* to laterally flank the doped region 116. The first gate protrusion 122*p*1 and second gate protrusion 122*p*2 have nearest neighboring inner sidewalls 122is1, 122is2, respectively, each of which extends in parallel with the line extending between the source region 202 and drain region 204 (see line A-A' and inner sidewalls 122is1, 122is2**).

A sidewall spacer 126, which can for example comprise silicon nitride, laterally surrounds outer sidewalls of the gate electrode 122. The sidewall spacer 126 is disposed along outer edges of the gate body **122*b*, and along outer edges of first gate protrusion 122*p*1 and the second gate protrusion 122*p*2. The sidewall spacer 126 extends from a top surface of the gate electrode 122 to bottom surfaces of the first gate protrusion 122*p*1 and second gate protrusion 122*p*2. The sidewall spacer 126 has an upper portion above the substrate 102 that has a first, smaller radius of curvature and has a lower portion extending into the substrate 102 that has a second, larger radius of curvature. The sidewall spacer 126 separates outer edges of the first gate protrusion 122*p*1 and the second gate protrusion 122*p*2 from the STI structure 104. The STI structure 104 extends past a common bottom surface of the first gate protrusion 122*p*1, the second gate protrusion 122*p*2, the gate dielectric 124, and the sidewall spacer 126**. In some embodiments, the common bottom surface is substantially level.

A gate electrode contact 130 and source/drain contacts 206 extend through the dielectric layer 128 and the gate electrode contact 130 electrically couples to the gate electrode 122 and the source/drain contacts 206 electrically couple to the source region 202 and drain region 204.

In some embodiments, transistor 100 may be referred to as a buried channel transistor. In such a configuration, the source region 202, the drain region 204, and the doped region 116 can have a first doping type (e.g., n-type), and the buried channel region 106 can have a second doping type (e.g., p-type), which is opposite the first doping type. Though the source region 202, drain region 204, and the doped region 116 can have the same doping type, the doped region 116 typically has a lower doping concentration than the source region 202 and the drain region 204. In this aspect, the doped region 116 and the buried channel region 106 form a p-n junction. As such, the transistor 100 can operate as a depletion mode metal-oxide-semiconductor field-effect transistor (MOSFET), and can be a normally "on" device.

To help limit noise such as dark current leakage in the transistor 100, a first doped liner 108 is disposed along inner sidewalls and a bottom surface of the STI structure 104; and a second doped liner 110 is disposed along outer sidewalls and the bottom surface of the STI structure. As can be seen from viewing FIGS. 2-3, the first doped liner 108 has a first thickness (**112*s*) as measured normal to an inner sidewall of the STI structure 104, and can have the first thickness (1121) as measured normal to the bottom surface of the STI structure 104. The second doped liner 110 has a second thickness (114*s*) as measured normal to an outer sidewall of the STI structure 104, and can have the second thickness (1141) as measured normal to the bottom surface of the STI structure 104. The second thickness 114*s*, 1141 is greater than the first thickness 112*s*, 1121. In alternative embodiments, the first thickness 112*s*, 1121 is different than the second thickness 114*s*, 1141. In some embodiments, the first thickness 112*s*, 1121 of the first doped liner 108 may, for example, be up to 30 nanometers (nm); and the second thickness 114*s*, 1141 may, for example, be up to 55 nm. In some embodiments, the first doped liner 108 and the second doped liner 110 can be monocrystalline silicon and can have the second doping type (e.g., where the second doping type is the same doping type as the buried channel region 106 and is opposite the first doping type of the source region 202 and drain region 204). In some embodiments, the first doped liner 108 comprises p-type semiconductor material with a doping concentration up to $1\times10^{18}$ impurities/cm$^3$; and the second doped liner 110** comprises p-type semiconductor material with a doping concentration up of $1\times10^{18}$ to $1\times10^{19}$ impurities/cm$^3$ or up to $1\times10^{19}$ impurities/cm$^3$.

As seen in FIG. 3, the first doped liner 108 separates the first gate protrusion **122*p*1 and the second gate protrusion 122*p*2 from the doped region 116. The first gate protrusion 122*p*1 and the second gate protrusion 122*p*2 extend to a bottom surface of the doped region 116. The doped region 116 has a height 134 common with the first gate protrusion 122*p*1 and the second gate protrusion 122*p*2. In some embodiments, the height 134 can, for example, be 30 nm to 150 nm. The doped region 116 has a top width 118 at a top surface of the doped region 116 and a bottom width 120 at the bottom surface of the doped region 116. In some embodiments, a ratio of the bottom width 120 to the top width 118** is less than two.

By forming the first doped liner 108 with the first thickness (e.g., 1121, **112*s*) that is smaller than the second thickness (e.g., 1141, 114*s*) of the second doped liner 110, widths (e.g., top width 118, bottom width 120) of doped region 116 can be optimized. Furthermore, by forming the gate electrode 122 with the first gate protrusion 122*p*1 and the second gate protrusion 122*p*2 with the common bottom surface with the doped region 116, the widths of the doped region 116 are optimized relative to a scheme where the first gate protrusion 122*p*1 and the second gate protrusion 122*p*2 extend past the doped region 116. As such, a channel region (e.g., channel region 106) can be effectively induced during transistor operation while minimizing current leakage for high resolution CIS applications. Furthermore, the transistor can be formed with a single etch of the substrate 102, thus minimizing damage to the substrate 102 which can result in increased noise during transistor operation. As such, inner sidewalls 122is1, 122is2 of the STI structure facing the channel region have a constant slope 132**.

Figure 4A:
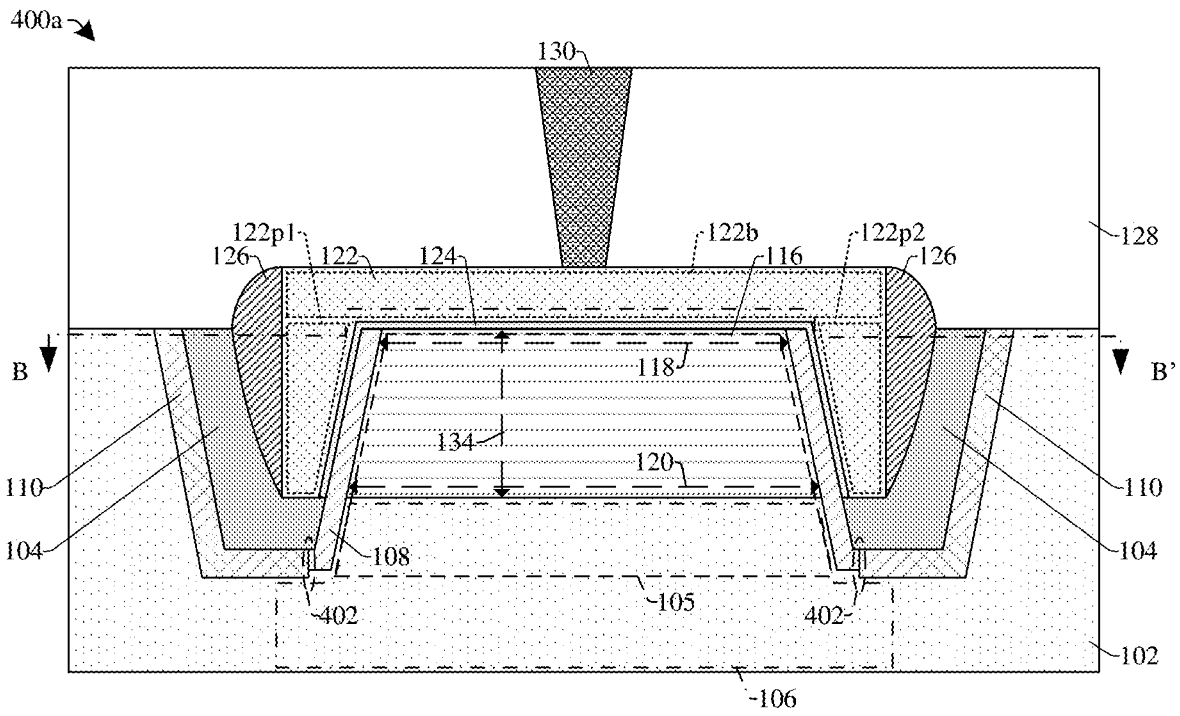
FIGS. 4A, 4B, and 5 illustrate cross-sectional views of some alternative embodiments of a semiconductor structure relative to FIG. 3.

FIG. 4A illustrates a cross-sectional view of some alternative embodiments of a semiconductor structure 400*a* relative to FIG. 3. Semiconductor structure 400*a* shows alternative embodiments of the first doped liner 108 and the second doped liner 110 relative to those described in FIG. 3. The first doped liner 108 abuts the second doped liner 110 at an interface 402, on the bottom surface of the STI structure 104, and directly below the first gate protrusion 122*p*1 and the second gate protrusion 122*p*2.

Figure 4B:
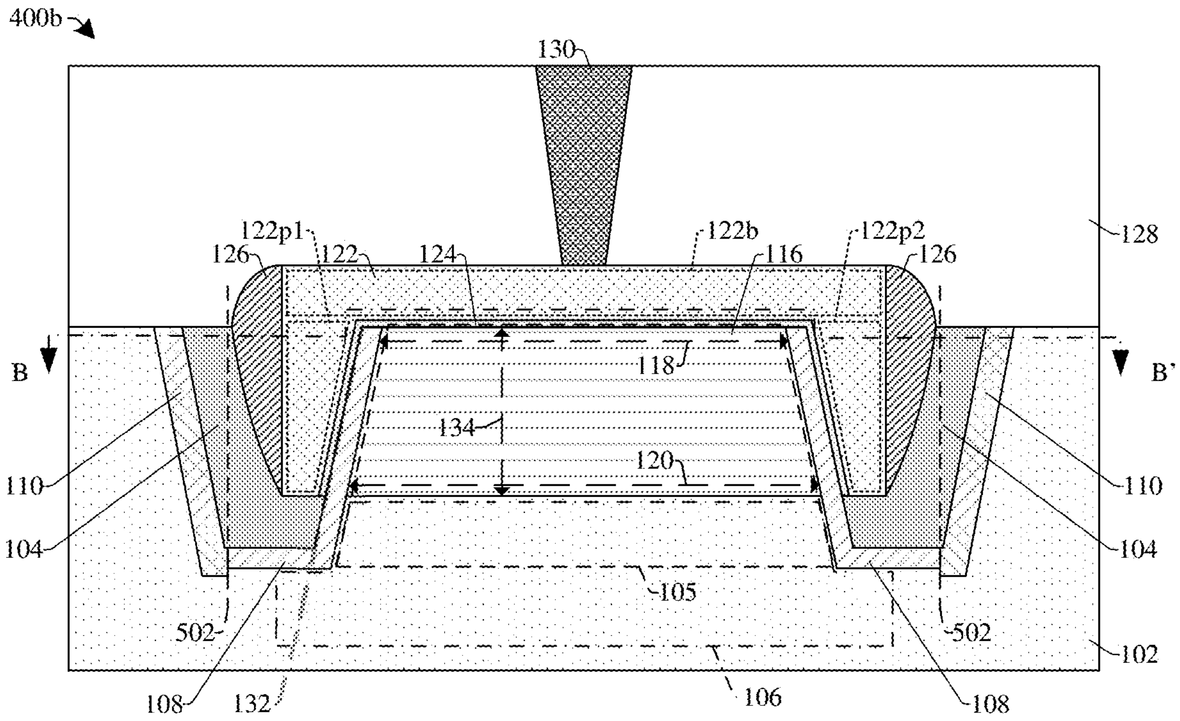

FIG. 4B illustrates a cross-sectional view of some alternative embodiments of a semiconductor structure 400*b* relative to FIG. 3. Semiconductor structure 400*b* shows alternative embodiments of the first doped liner 108 and the second doped liner 110 relative to those described in FIG. 3. The first doped liner 108 and the second doped liner 110 abut at an interface 502, on the bottom surface of the STI structure 104, and laterally offset from the gate electrode 122 and sidewall spacer 126.

Figure 5:
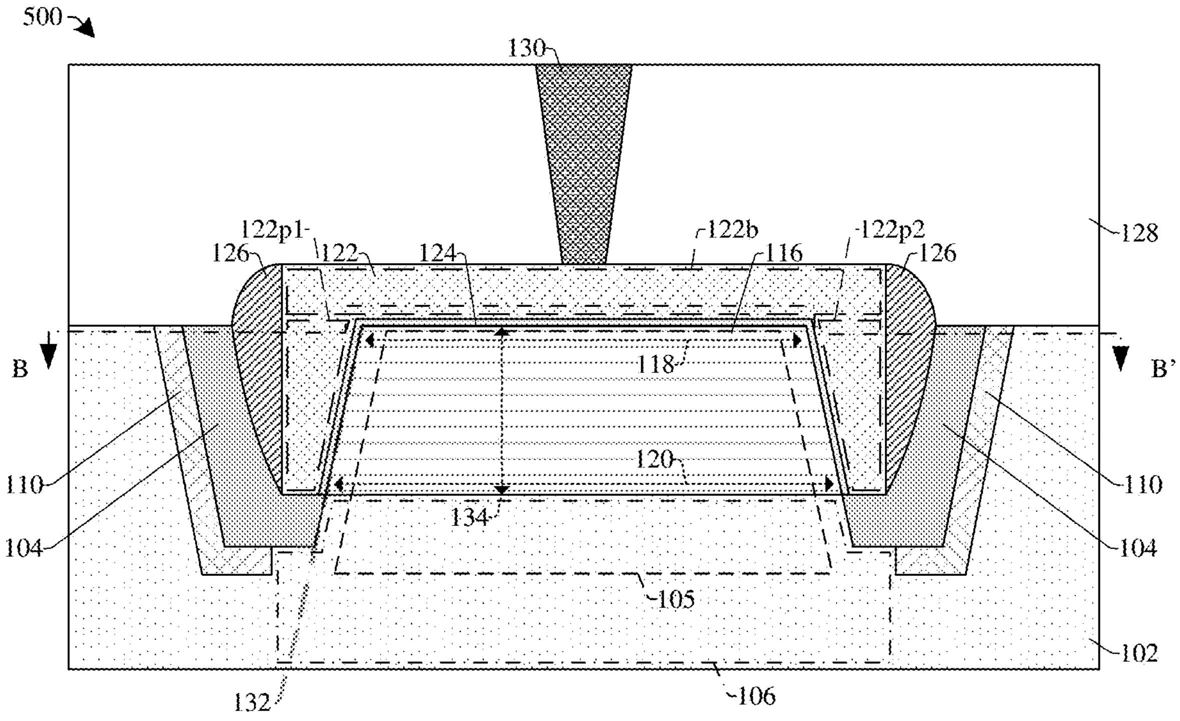

FIG. 5 illustrates a cross-sectional view of some alternative embodiments of a semiconductor structure 500 relative to FIG. 3. Semiconductor structure 500 shows alternative embodiments of the first doped liner 108 and the doped region 116 relative to those described in FIG. 3. Specifically, semiconductor structure 500 lacks the first doped liner 108 of FIG. 3. In some aspects, the buried channel region 106 can be optimally induced by increasing the size of the doped region 116 and eliminating the first doped liner 108 of FIG. 3. As such, the top width 118 and the bottom width 120 of the doped region 116 can be increased if the first doped liner 108 of FIG. 3 is not formed. In this embodiment, the doped region 116 abuts the gate dielectric 124, and the STI structure 104 contacts the buried channel region 106.

Figure 6:
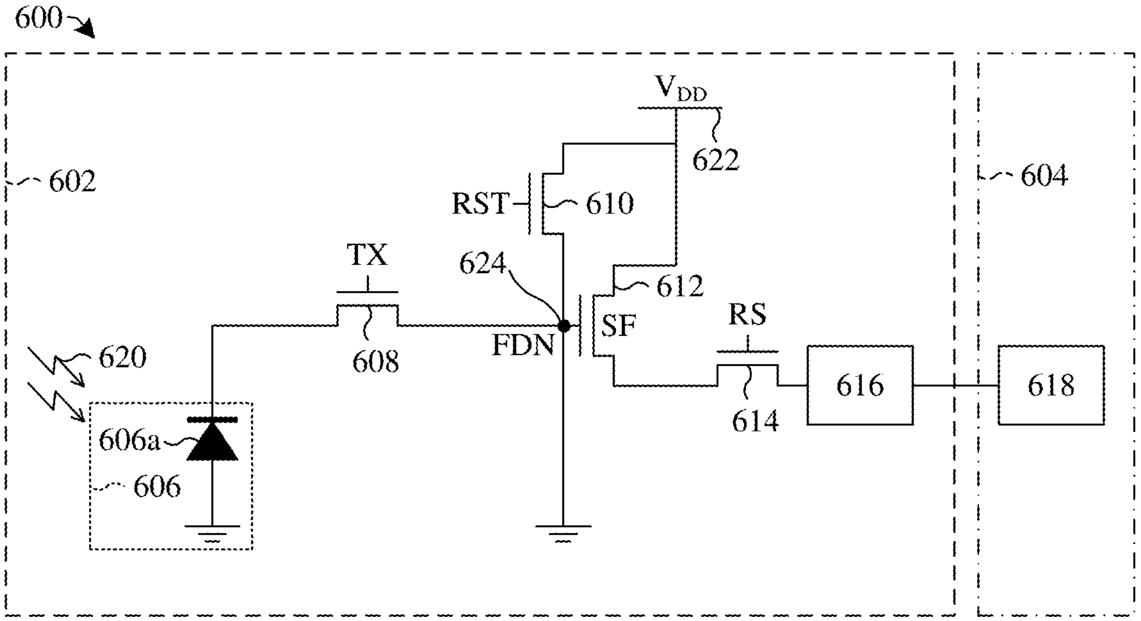
FIG. 6 illustrates a circuit diagram of some embodiments of an image sensor with a source follower transistor.

FIG. 6 illustrates a circuit diagram 600 of some embodiments of an image sensor with a source follower transistor in accordance with some embodiments herein.

Circuit diagram 600 illustrates a CIS device with a floating diffusion node (FDN) 624 selectively coupled to a photodetector 606 by a transfer transistor 608, where the photodetector 606 is excited by light 620. FDN 624 is also selectively coupled to a power source 622 by a reset transistor 610. The photodetector 606 may be, for example, a single photodiode 606*a*, and/or the power source 622 may be, for example, a direct current (DC) power source such as a $V_{DD}$ line. The transfer transistor 608 is configured to selectively transfer charge accumulated in the photodetector 606 to the FDN 624, and the reset transistor 610 is configured to set (e.g., clear or pre-charge) charge stored at the FDN 624. The FDN 624 gates a source follower transistor 612 that selectively couples the power source 622 to a row select transistor 614, and the row select transistor 614 selectively couples the source follower transistor 612 to an output 616. The output 616 may be, for example, an in-pixel circuit. The output may then connect to an application specific integrated circuit (ASIC) circuit 618. The source follower transistor 612 is configured to non-destructively read and amplify charge stored at the FDN 624, and the row select transistor 614 is configured to select the pixel sensor for readout. The source follower transistor 612 can be the semiconductor device of FIGS. 1-3, and can be a buried channel transistor as discussed in accordance with FIGS. 1-3.

Furthermore, the CIS device can be fabricated on a first chip 602 and a second chip 604. The first chip 602 can include the photodetector, transfer transistor 608, FDN 624, reset transistor 610, power source 622, source follower transistor 612, row select transistor 614, and output 616. The second chip 604 can include the ASIC circuit.

Figure 7:
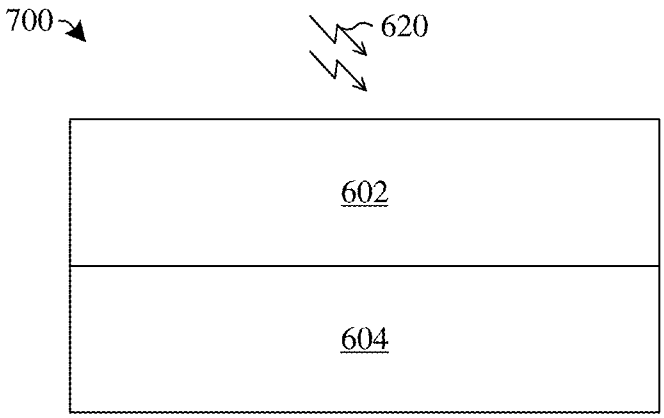
FIG. 7 illustrates a cross-sectional view of an image sensor in accordance with some embodiments.

FIG. 7 illustrates a cross-sectional view 700 of an image sensor including the first chip 602 and the second chip 604 of FIG. 6. The light 620 scatters on the surface of the first chip 602, and the first chip 602 sends signaling associated with the light 620 to the ASIC 618 of the second chip 604 for processing.

Figure 8:
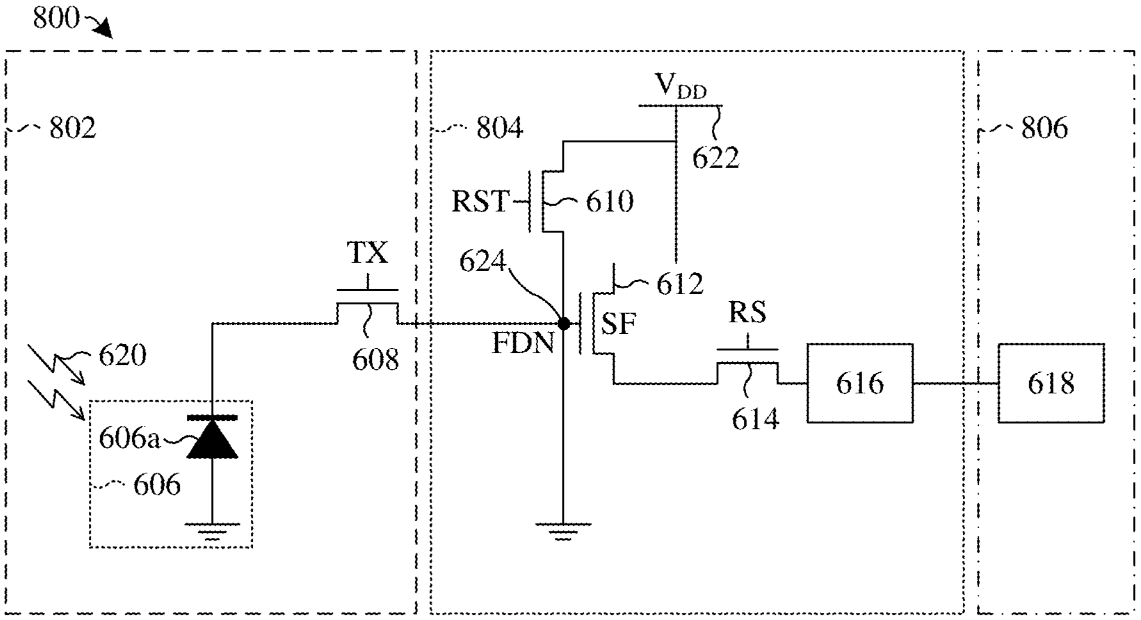
FIG. 8 illustrates a circuit diagram of some embodiments of an image sensor with a source follower transistor.

FIG. 8 illustrates a circuit diagram 800 of some embodiments of an image sensor with a source follower transistor formed in three chips. FIG. 8 illustrates the same features as FIG. 6 with the alternative of three chip as opposed to a two chips. The first chip 802 can include the photodetector and the transfer transistor 608. The second chip 804 can include the FDN 624, reset transistor 610, power source 622, source follower transistor 612, row select transistor 614, and output 616. The third chip 806 can include the ASIC circuit.

Figure 9:
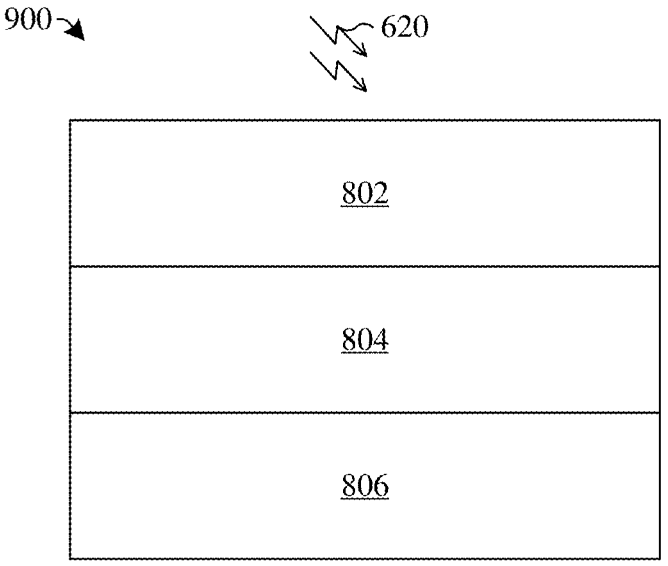
FIG. 9 illustrates a cross-sectional view of an image sensor in accordance with some embodiments.

FIG. 9 illustrates a cross-sectional view 900 of a first chip 802, a second chip 804, and a third chip 806 of FIG. 8. The light 620 scatters on the surface of the first chip 802 which sends a photocurrent to the second chip 804 which reads and amplifies the photocurrent and sends signaling to the ASIC 618 of the third chip 806 for processing.

FIGS. 10-33 illustrate cross-sectional views of some embodiments of methods of forming a semiconductor device with a source, a drain, a gate, and a STI structure with a first doped liner and a second doped liner. Although the cross-sectional views 1000-3300 shown in FIGS. 10-33 are described with reference to a method, it will be appreciated that the structures shown in FIGS. 10-33 are not limited to the method but rather may stand alone separate of the method. Furthermore, although FIGS. 10-33 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part. Also, alternative embodiments depicted in FIGS. 1-5 may be substituted for embodiments in FIGS. 10-33 although they may not be shown.

Figure 10:
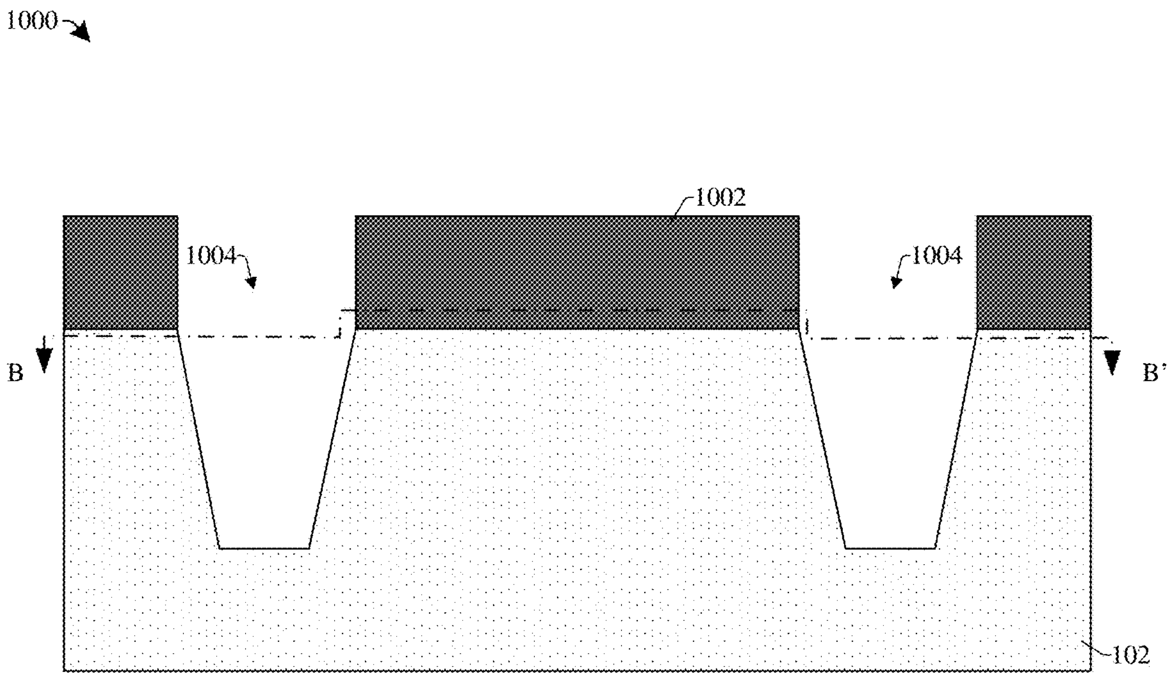
FIGS. 10-33 illustrate cross-sectional views of some embodiments of methods of forming a semiconductor device with a source, a drain, a gate, and a STI structure with a first doped liner and a second doped liner.
Figure 11:
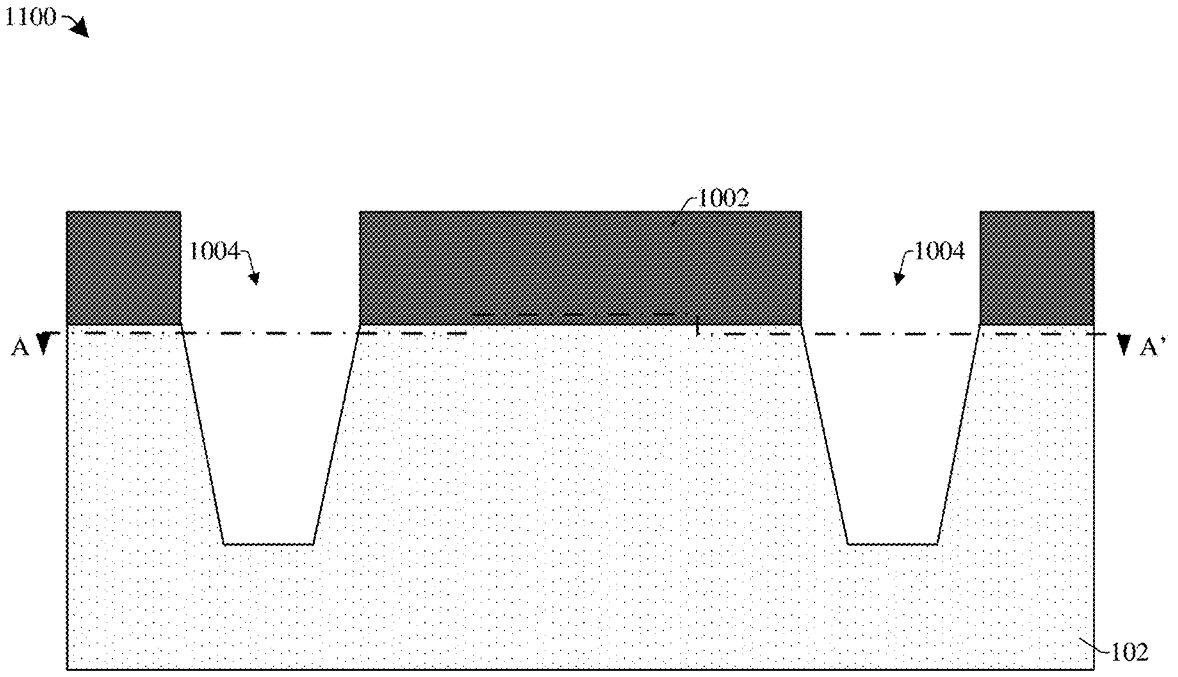

As shown in cross-sectional view 1000 of FIG. 10 and cross-sectional view 1100 of FIG. 11, a mask 1002 is formed over a substrate 102. Cross-sectional view 1100 shows a first direction along a line (e.g., corresponding to line A-A') of the semiconductor device and cross-sectional view 1000 shows a second direction along a line (e.g., corresponding to line B-B') of the semiconductor device, where the first direction and the second direction are perpendicular. The substrate 102 may be or comprise, for example, silicon (Si), monocrystalline silicon, germanium (Ge), silicon-germanium (SiGe), gallium arsenide (GaAs), some other semiconductor material, or a combination thereof. The semiconductor substrate may also be a semiconductor on insulator substrate. The mask 1002 may be or comprise, for example, photoresist, silicon nitride, or some other suitable mask material. In some embodiments, the substrate 102 is formed with a second doping type. In some embodiments the second doping type is a p-type dopant.

Forming the mask 1002 includes a patterning process (not shown). The patterning process may, for example, comprise any of a photolithography process and an etching process. In some embodiments (not shown), a photoresist is formed over the mask 1002. The photoresist is patterned by an acceptable photolithography technique to develop an exposed photoresist. With the exposed photoresist in place, an etch is performed to transfer the pattern from the exposed photoresist to the underlying layers, for example, the mask 1002, to form opening 1004 that extend through the mask 1002. The etching process may comprise a wet etching process, a dry etching process, or some other suitable etching process.

Subsequently, the substrate 102 is etched with mask 1002 on the substrate 102 to form a STI trench beneath opening 1004. Etching the substrate 102 can include a wet etching process, a dry etching process, or some other suitable etching process.

Figure 12:
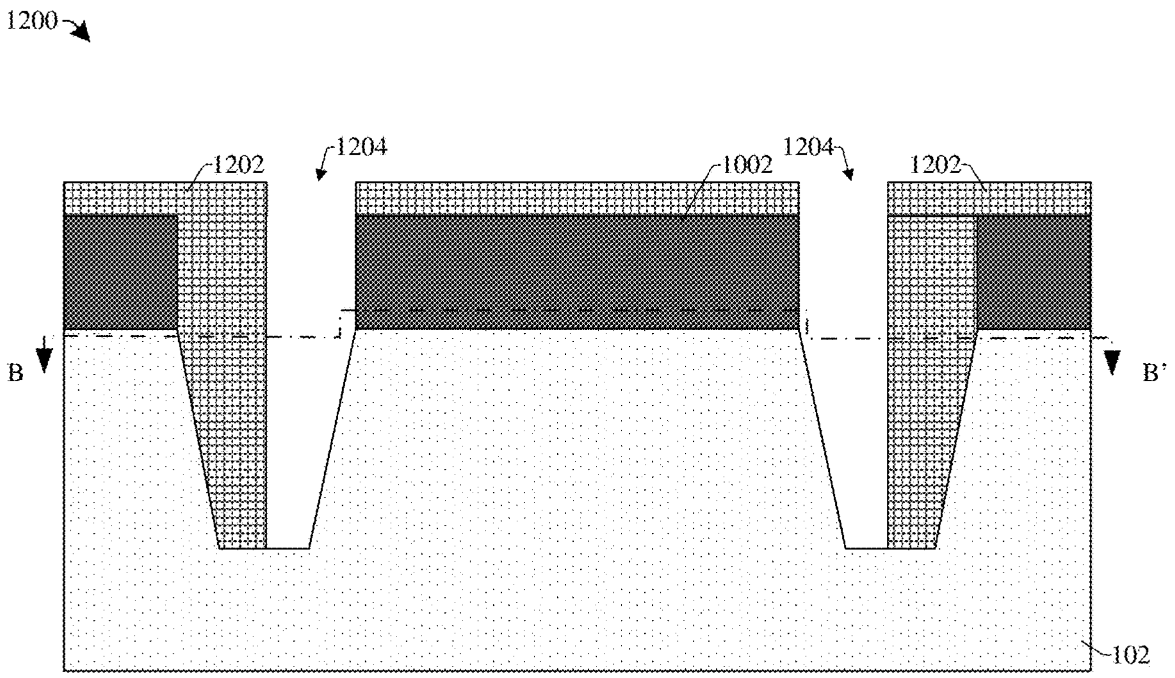
Figure 13:
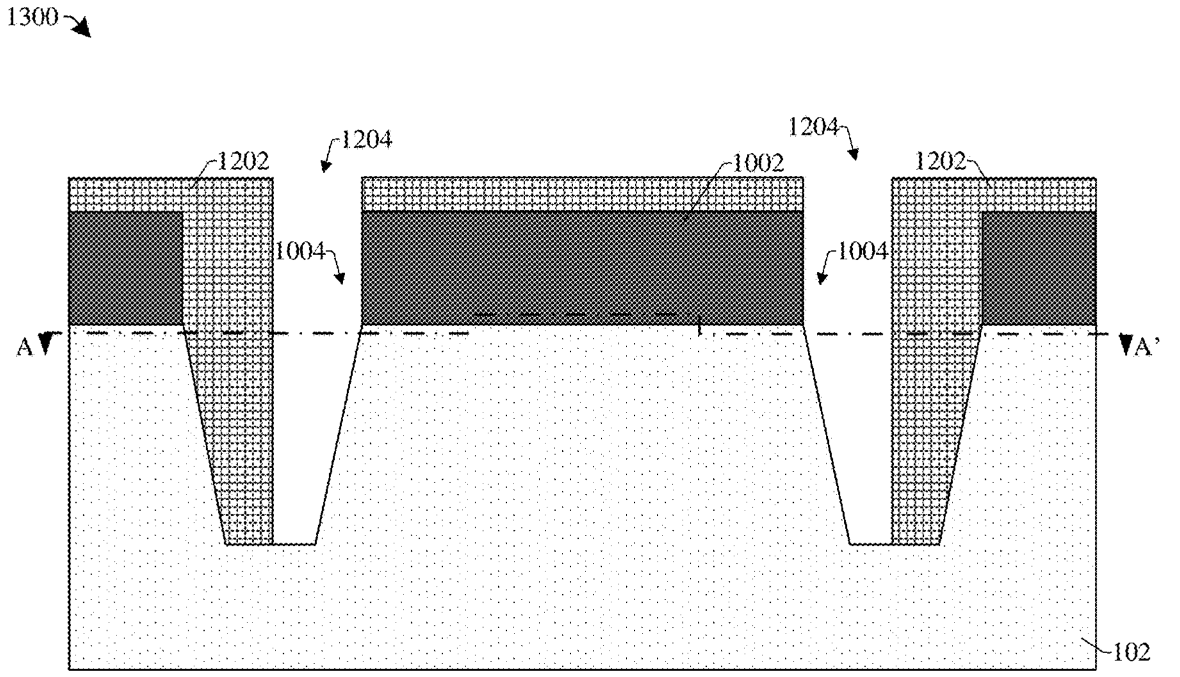

As shown in cross-sectional view 1200 of FIG. 12 and cross-sectional view 1300 of FIG. 13, a first photoresist 1202 is formed over the mask 1002 and in the STI trench below opening 1004. Cross-sectional view 1300 shows the first direction and cross-sectional view 1200 shows the second direction. The first photoresist 1202 is formed by a suitable deposition process and is patterned by an acceptable photolithography technique to form opening 1204 through the first photoresist 1202. Opening 1204 is aligned over inner sidewalls and a top surface of the STI trench, where inner surfaces and part of a bottom surface of the STI trench are exposed. Thus the first photoresist 1202 covers outer sidewalls and part of the bottom surface of the STI trench.

Figure 14:
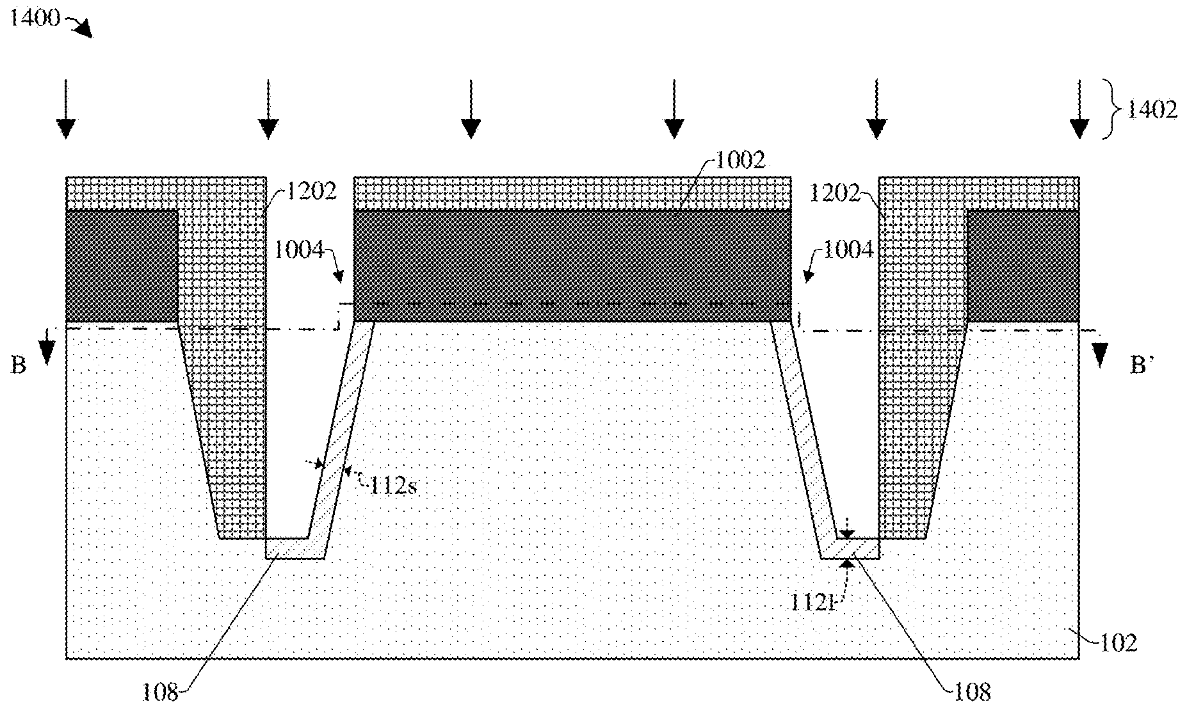
Figure 15:
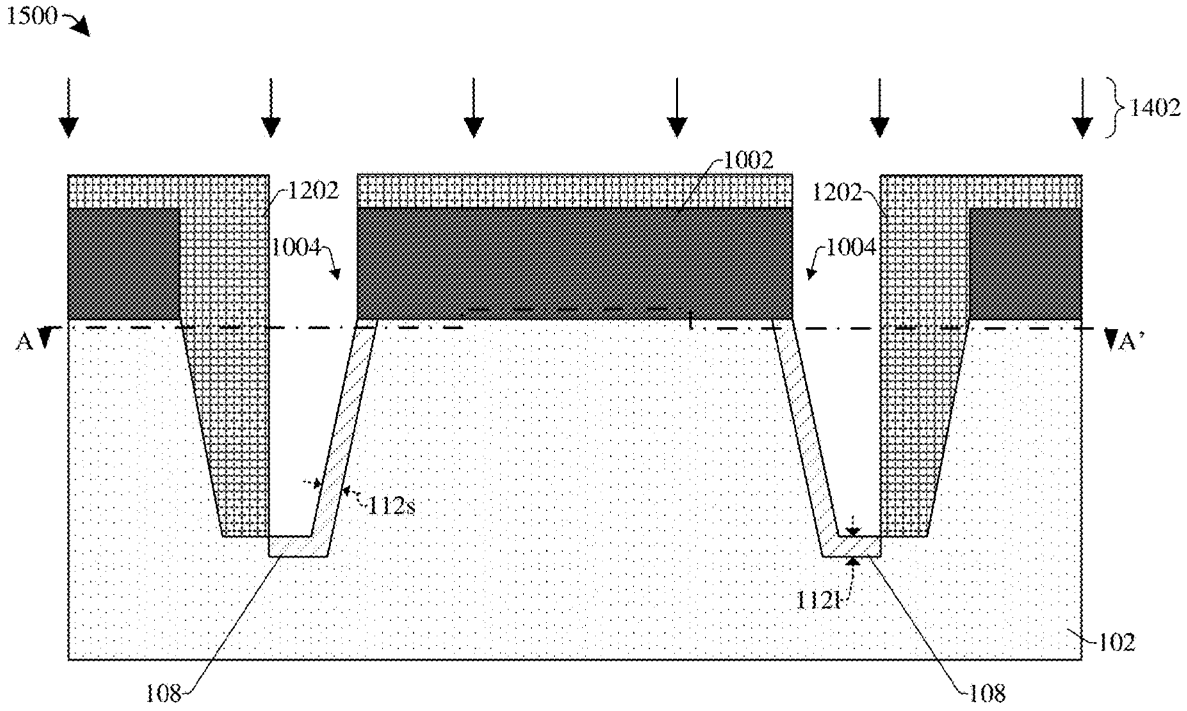

As shown in cross-sectional view 1400 of FIG. 14 and cross-sectional view 1500 of FIG. 15, a first doped liner 108 is formed in the substrate 102. Cross-sectional view 1500 shows the first direction and cross-sectional view 1400 shows the second direction. The first doped liner 108 is formed by a first doping process 1402, such as an ion implantation process.

Portions of the STI trench that are uncovered by the first photoresist 1202 are exposed to the first doping process 1402 such that the first doped liner 108 is formed with a first thickness (112*s*) as measured normal to an inner sidewall of the STI trench and a first thickness (1121) as measured normal to a bottom surface of the STI trench. For example, ions can be implanted with a first implantation energy and/or can be driven in with a first drive in temperature or duration to establish the first thickness 112*s*, 1121. In some embodiments, the first thickness 112*s*, 1121 of the first doped liner 108 may, for example, be up to 30 nanometers (nm). The first doping process 1402 can include the second doping type. As such, in some embodiments the first doped liner 108 is formed with the same doping type as the substrate 102, where the first doped liner 108 has a higher doping concentration than the substrate 102. In some or similar embodiments, the first doped liner 108 is a p-type material with a doping concentration up to $1\times10^{18}$ impurities/cm$^3$. The first doped liner 108 extends along the inner sidewall of the STI trench and extends along the bottom surface of the STI trench.

It is noted that in some embodiments, for example, semiconductor structure 500 of FIG. 5, the first doped liner 108 is not formed. In such embodiments, the method described in FIGS. 12-15 may not be performed.

Figure 16:
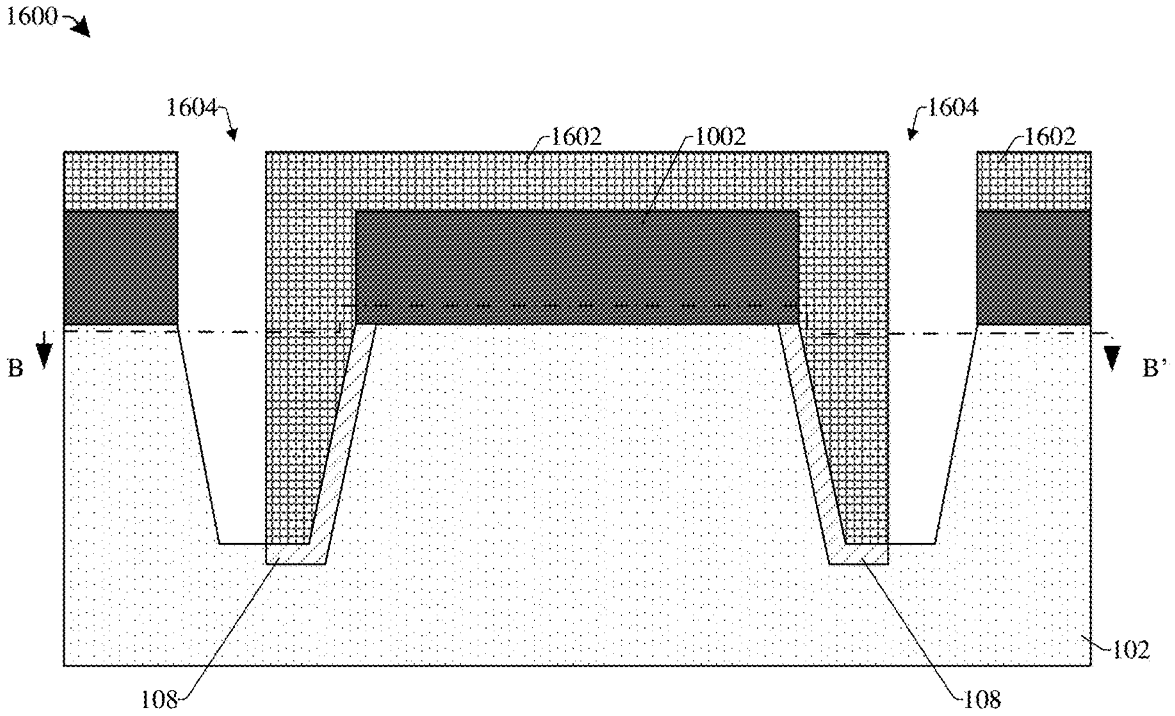
Figure 17:
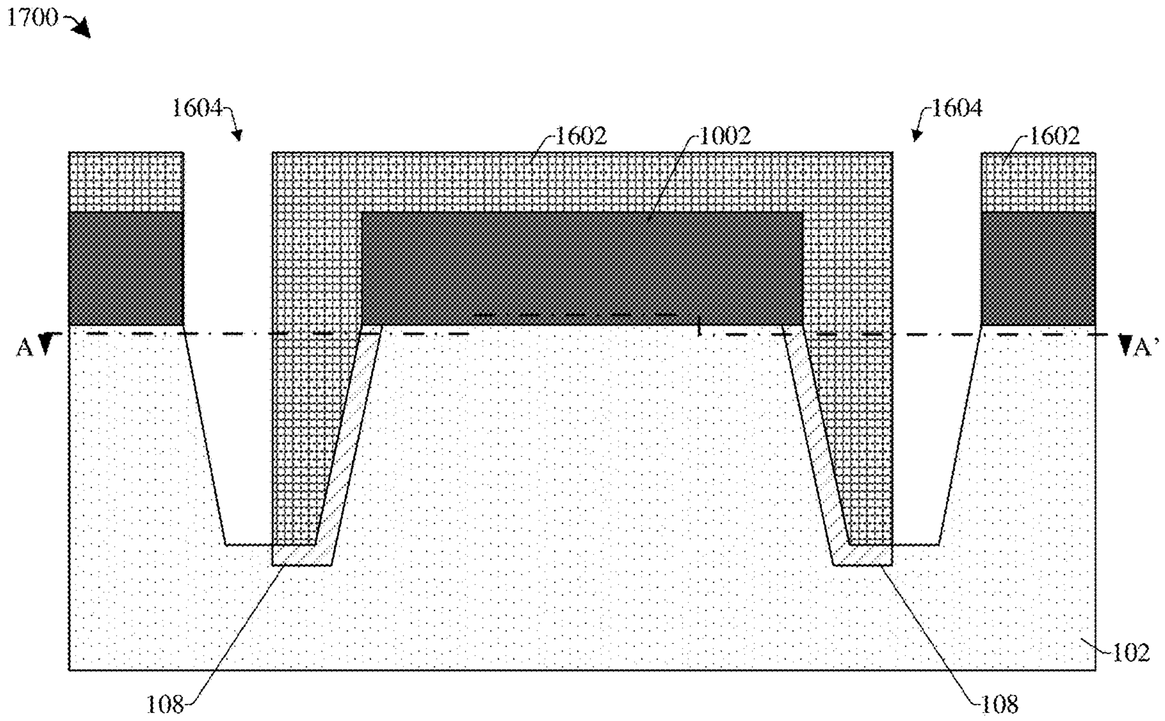

As shown in cross-sectional view 1600 of FIG. 16 and cross-sectional view 1700 of FIG. 17, a second photoresist 1602 is formed over the first doped liner 108. Cross-sectional view 1700 shows the first direction and cross-sectional view 1600 shows the second direction. In some embodiments, where the first doped liner 108 is formed, the first photoresist 1202 of FIGS. 14-15 is removed through a removal process. A second photoresist 1602 is formed by a suitable deposition process over the mask, over the first doped liner 108, and formed within the STI trench. The second photoresist 1602 is patterned by an acceptable photolithography technique to form opening 1604. Opening 1604 is formed over outer sidewalls of the STI trench and over a bottom surface of the STI trench offset from the first doped liner 108. As such, outer sidewalls of the STI trench and the bottom surface of the STI trench offset from the first doped liner 108 are exposed by opening 1604.

Figure 18:
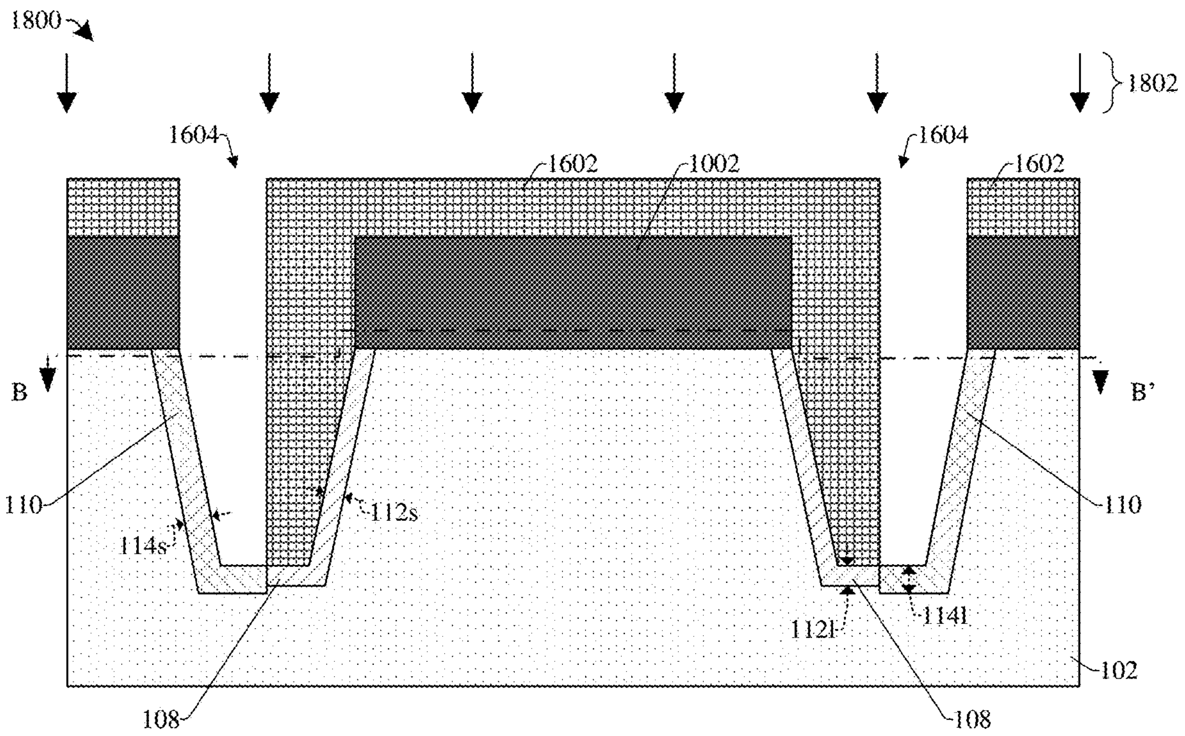
Figure 19:
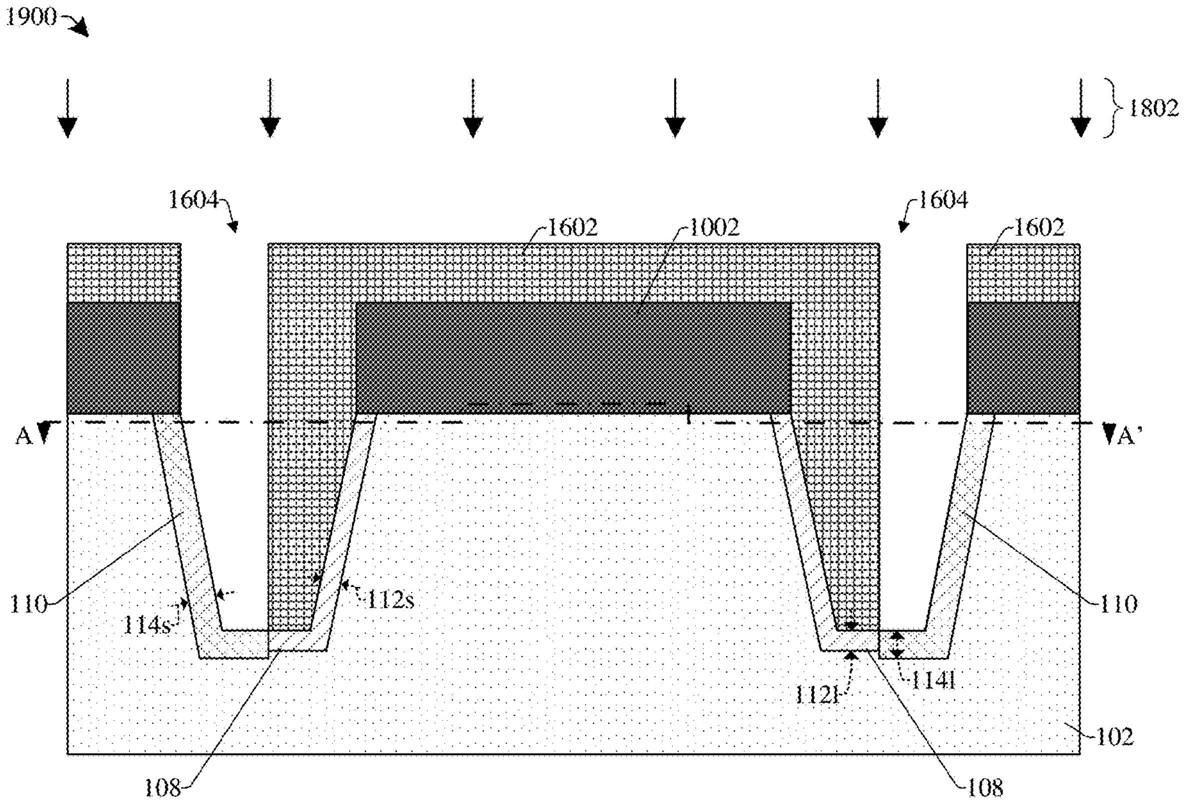

As shown in cross-sectional view 1800 of FIG. 18 and cross-sectional view 1900 of FIG. 19, a second doped liner is formed by a second doping process 1802. Cross-sectional view 1900 shows the first direction and cross-sectional view 1800 shows the second direction. Portions of the STI trench that are uncovered by the second photoresist 1602 are exposed to the second doping process 1802 such that the second doped liner 110 is formed with a second thickness (114*s*) as measured normal to an outer sidewall of the STI trench, and a second thickness (1141) as measured normal to the bottom surface of the STI trench. For example, the second doping process can make use of a second implantation energy greater than the first implantation energy, and/or can make use of a second drive in temperature or duration that is greater than the first drive in temperature or duration. In some embodiments, the second thickness 114*s*, 1141 is greater than the first thickness 112*s*, 1121. In other embodiments, the second thickness 114*s*, 1141 is different than the first thickness 112*s*, 1121. In some embodiments, the second thickness 114*s*, 1141 may, for example, be up to 55 nm in thickness. In some embodiments the second doping process 1802 can include the second doping type. As such, in some embodiments, the second doped liner 110 is formed with the same doping type as the first doped liner 108. In some or similar embodiments, the second doped liner 110 is doped to a higher concentration than the first doped liner 108. In some or similar embodiments, the second doped liner 110 is p-type doped with a doping concentration of up to $1\times10^{19}$ impurities/cm$^3$. In some or similar embodiments, the second doped liner 110 is p-type doped with a doping concentration of $1\times10^{18}$ to $1\times10^{19}$ impurities/cm$^3$. The second doped liner 110 is formed extending along the outer sidewall of the STI trench and extends along the bottom surface of the STI trench such that the second doped liner 110 abuts the first doped liner 108.

Figure 20:
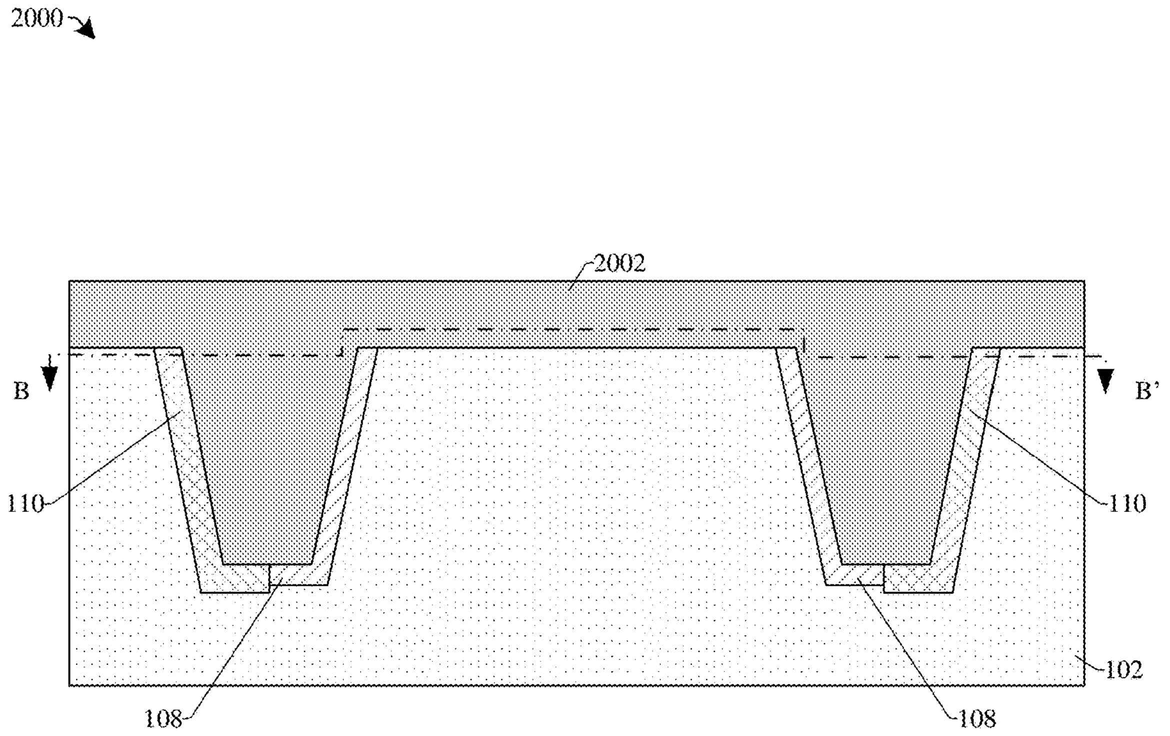
Figure 21:
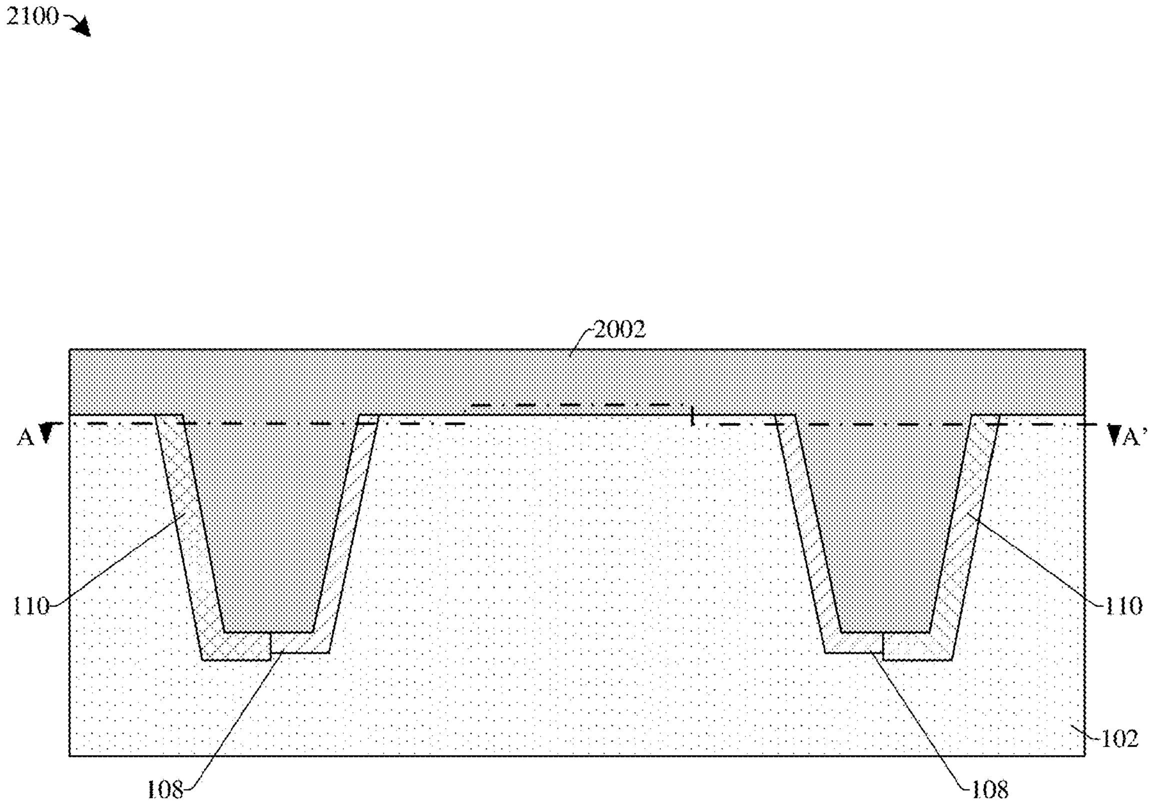

As shown in cross-sectional view 2000 of FIG. 20 and cross-sectional view 2100 of FIG. 21, a dielectric layer 2002 is formed over the substrate 102, the first doped liner 108, and the second doped liner 110. Cross-sectional view 2100 shows the first direction and cross-sectional view 2000 shows the second direction. The mask 1002 of FIGS. 18 and 19 and the second photoresist 1602 of FIGS. 18 and 19 are removed by a removal process. The removal process may, for example, be a chemical wash process, an etch process, a planarization process, an ashing process, or other suitable removal process. The dielectric layer 2002 is formed in the STI trench covering the first doped liner 108, the second doped liner 110, and the semiconductor substrate. The dielectric layer 2002 may, for example, be or comprise a dielectric material (e.g., silicon dioxide), a low-k dielectric, or the like. The dielectric layer 2002, may, for example, be deposited by PVD, CVD, or ALD process.

Figure 22:
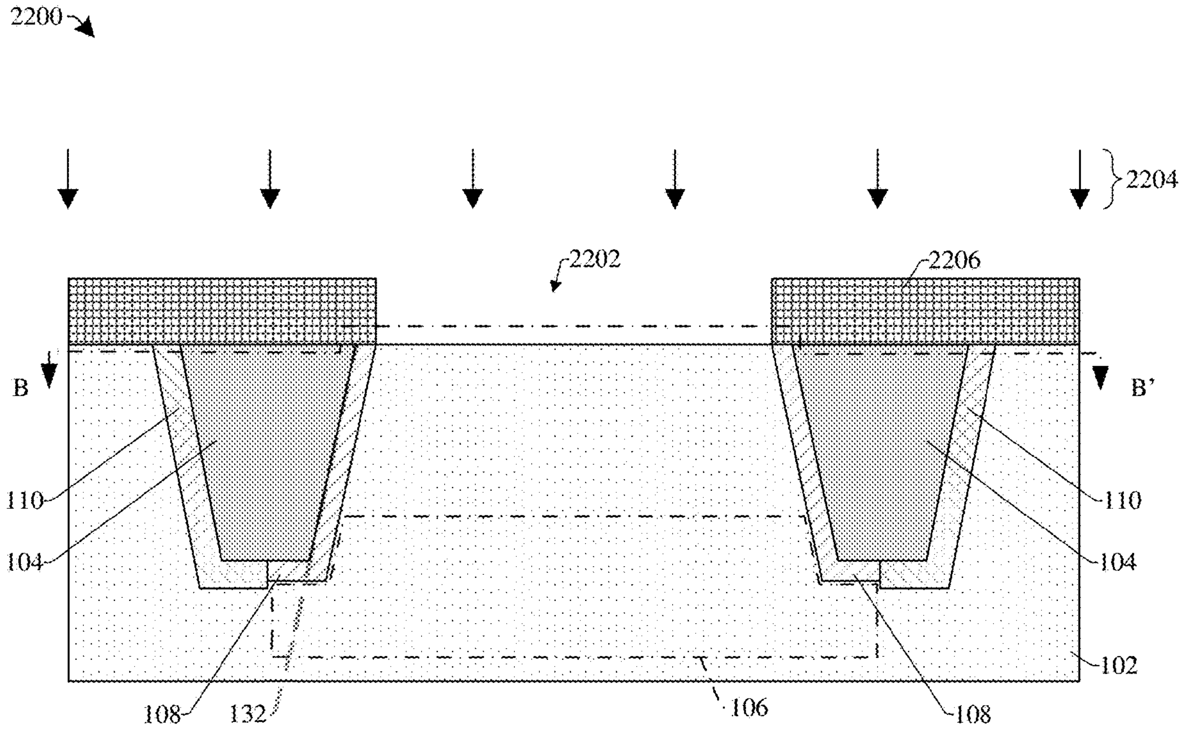
Figure 23:
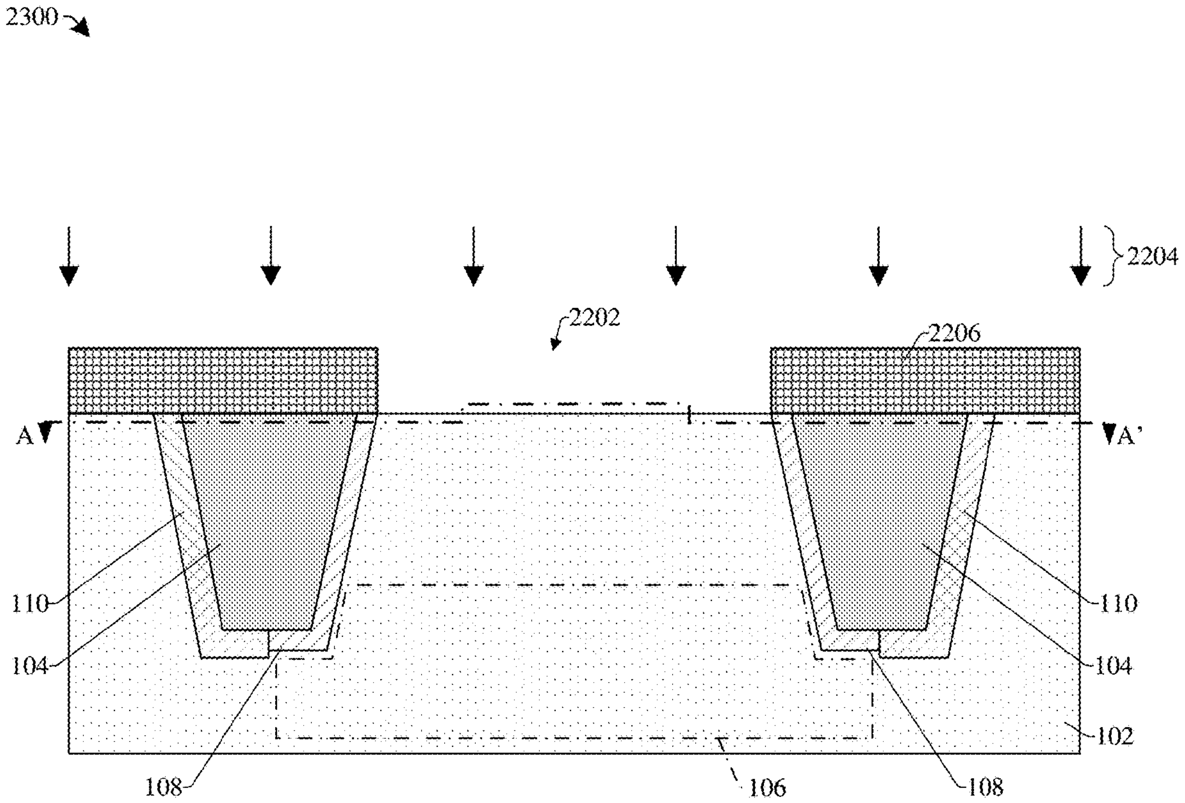

As shown in cross-sectional view 2200 of FIG. 22 and cross-sectional view 2300 of FIG. 23, a STI structure 104 is formed and a buried channel region 106 is formed within the substrate 102. Cross-sectional view 2300 shows the first direction and cross-sectional view 2200 shows the second direction. The STI structure 104 is formed by removing the dielectric layer 2002 of FIGS. 20-21 from above the substrate 102 by an etching process. The STI structure 104 is formed extending from a top surface of the substrate 102 to above bottom portions of the first doped liner 108 and the second doped liner 110. As such, the STI structure 104 fills the STI trench.

The buried channel region 106 is formed within the substrate 102 according to a third doping process 2204. A third photoresist 2206 is deposited and patterned on the substrate 102 and over top surfaces of the first doped liner 108, the second doped liner 110, and the STI structure 104. The patterning of the third photoresist 2206 forms an opening 2202 over the semiconductor substrate between inner sidewalls of the STI structure 104. The opening 2202 is exposed to the third doping process 2204, such as ion implantation, to form the buried channel region 106. The third doping process 2204 can include the second doping type. The buried channel region 106 is formed between surfaces of the first doped liner 108, and extends under the STI structure 104. In some embodiments, the second doped liner 110 is thicker than the first doped liner 108, and the buried channel region 106 extends between bottom edges of the second doped liner 110.

Figure 24:
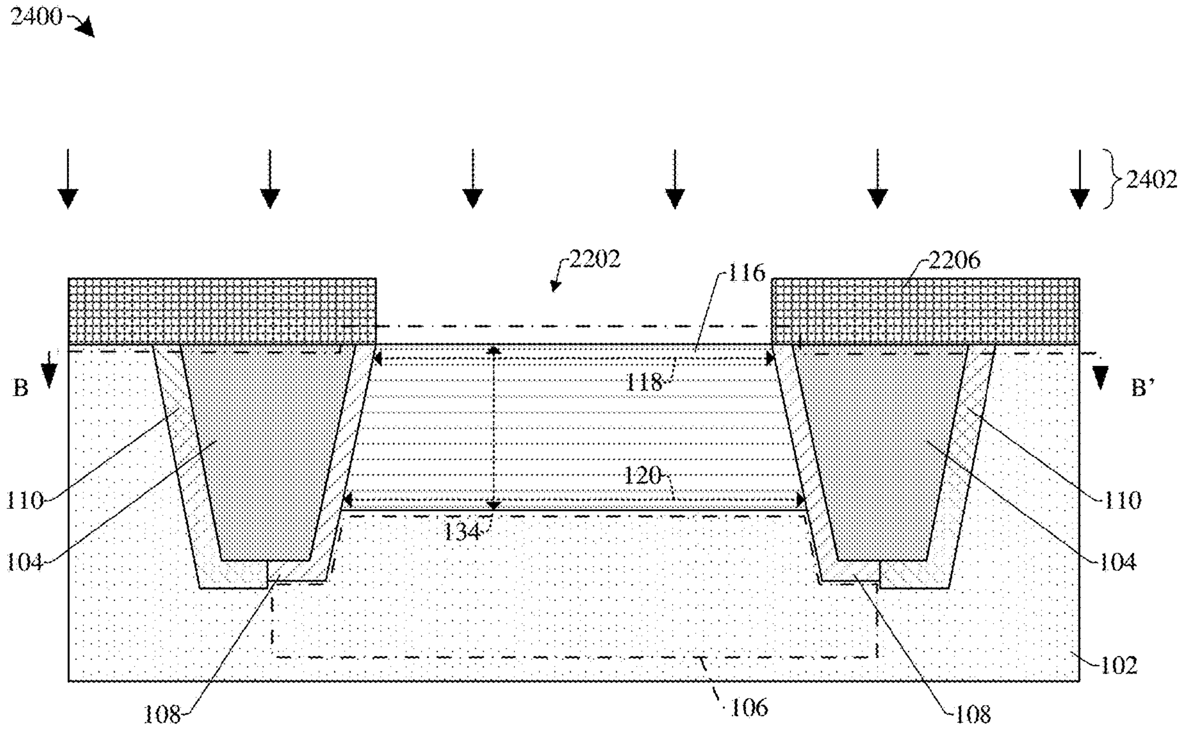
Figure 25:
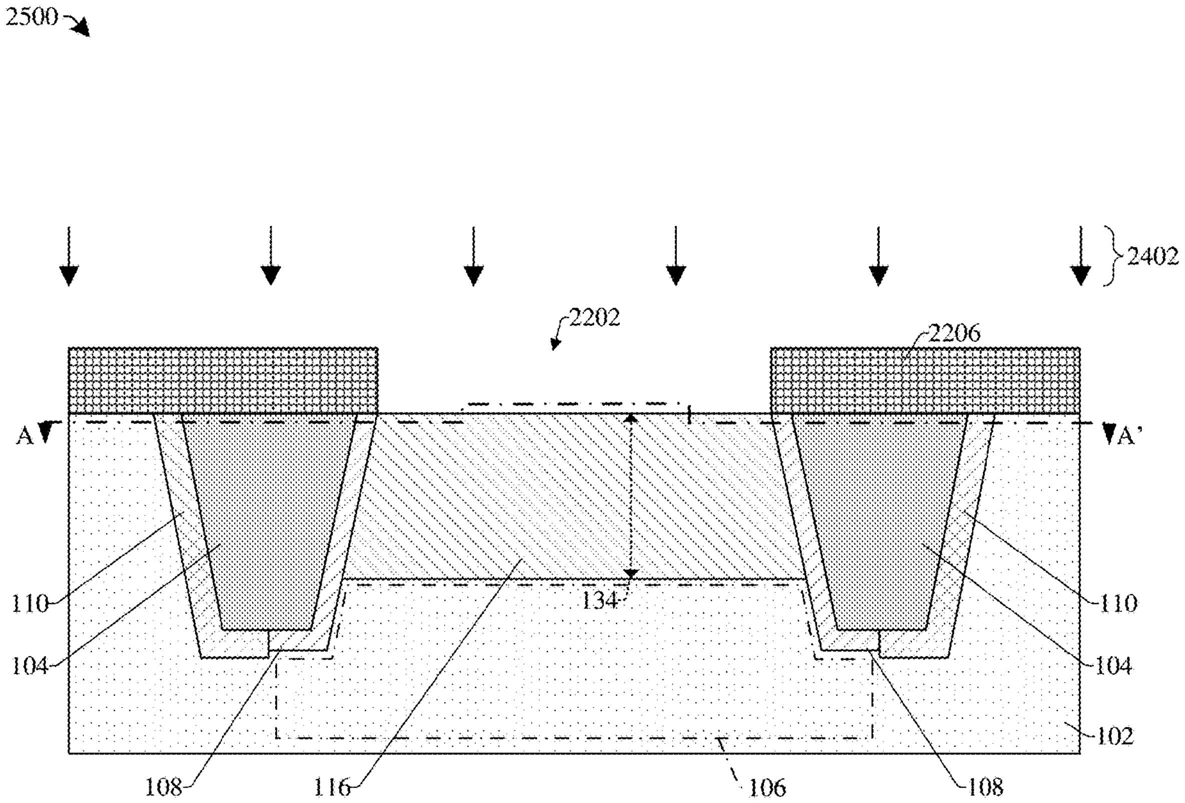

As shown in cross-sectional view 2400 of FIG. 24 and cross-sectional view 2500 of FIG. 25, a doped region 116 is formed in the substrate 102. Cross-sectional view 2500 shows the first direction and cross-sectional view 2400 shows the second direction. The doped region 116 is formed within the semiconductor substrate according to a fourth doping process 2402 and formed above the buried channel region 106. In some embodiments the doped region 116 is buried within the buried channel region 106. The opening 2202 is exposed to the fourth doping process 2402, such as ion implantation, to form the doped region 116. The fourth doping process 2402 can include a first doping type. In some embodiments, the first doping type is an n-type dopant. In some embodiments, the doped region 116 is formed with the first doping type to a doping concentration of $1\times10^{17}$ to $1\times10^{18}$ impurities/$cm^3$. The doped region 116 is formed with a height 134 below the substrate 102, where the height 134 can, for example, be 30 nm to 150 nm. Furthermore, in the first direction, the doped region 116 is formed with a top width 118 at a top surface of the doped region 116 and a bottom width 120 at a bottom surface of the doped region 116. In some embodiments, a ratio of the bottom width 120 to the top width 118 is less than two in the first direction. As such, the widths (e.g., top width 118, bottom width 120) of the doped region 116 can be optimized according to a distance between inner surfaces of the STI structure 104 and the first width 112 of the first doped liner 108.

Figure 26:
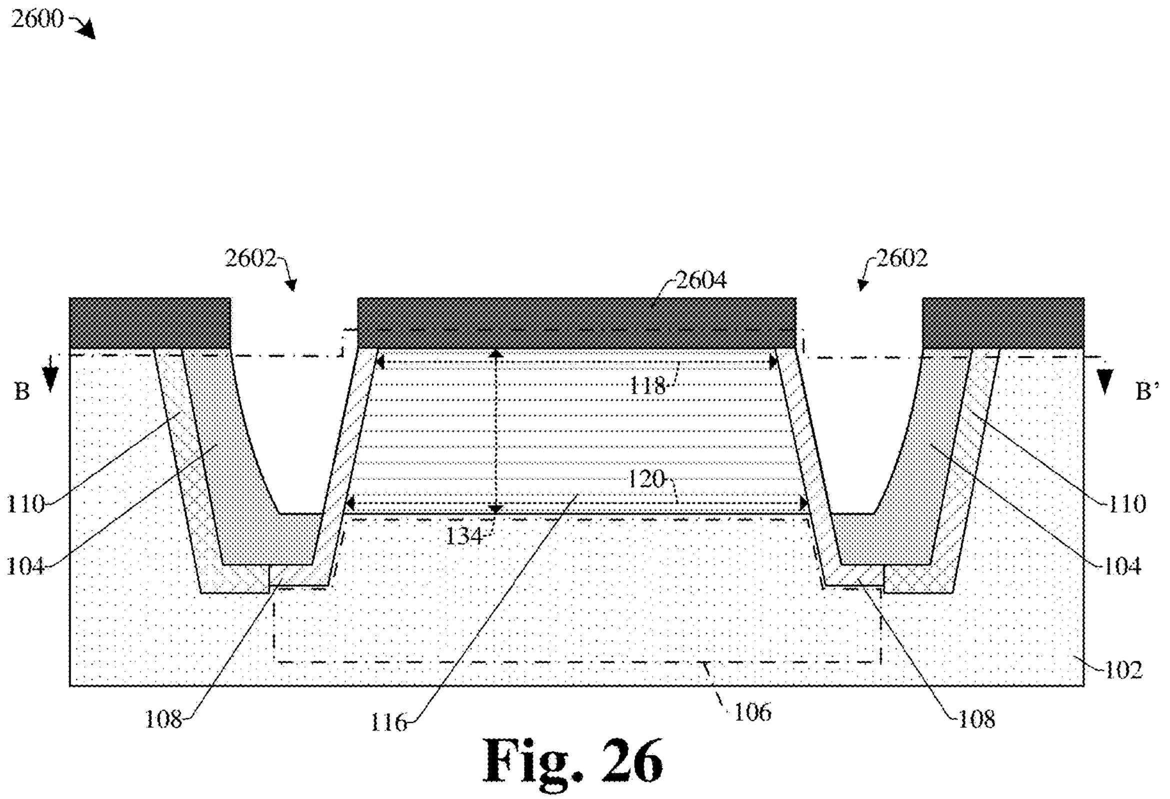
Figure 27:
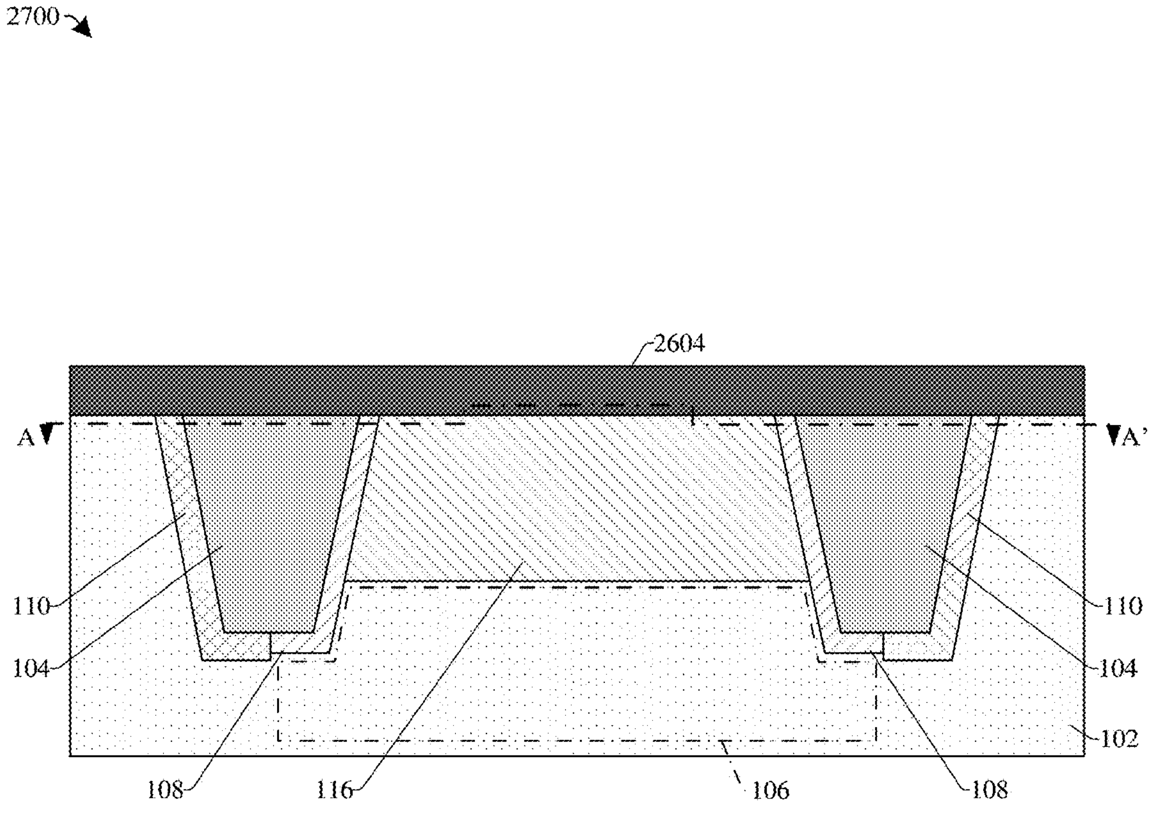

As shown in cross-sectional view 2600 of FIG. 26 and cross-sectional view 2700 of FIG. 27, a gate opening 2602 is formed within the STI structure 104. Cross-sectional view 2700 shows the first direction and cross-sectional view 2600 shows the second direction. The third photoresist 2206 of FIGS. 24-25 is removed by a removal process such as a chemical wash process, an etch process, a planarization process, an ashing process, or other suitable removal process. A mask 2604 is formed over the substrate 102, the first doped liner 108, the second doped liner 110, the STI structure 104, and the doped region 116. The mask 2604 is subsequently patterned exposing a top surface of the STI structure 104. The top surface of the STI structure 104 is subsequently etched forming gate opening 2602 in the STI structure 104 in the first direction. The mask 2604 is not etched in the second direction. Gate opening 2602 within the STI structure 104 extends to the bottom surface of the doped region 116. As such, gate opening 2602 is formed such that the gate opening 2602 and the doped region 116 have a common bottom surface that is substantially level. Gate opening 2602 exposes a surface of the first doped liner, and an inner surface of the STI structure 104. As such, gate opening 2602 is formed separated from the second doped liner 110 by the STI structure 104.

Figure 28:
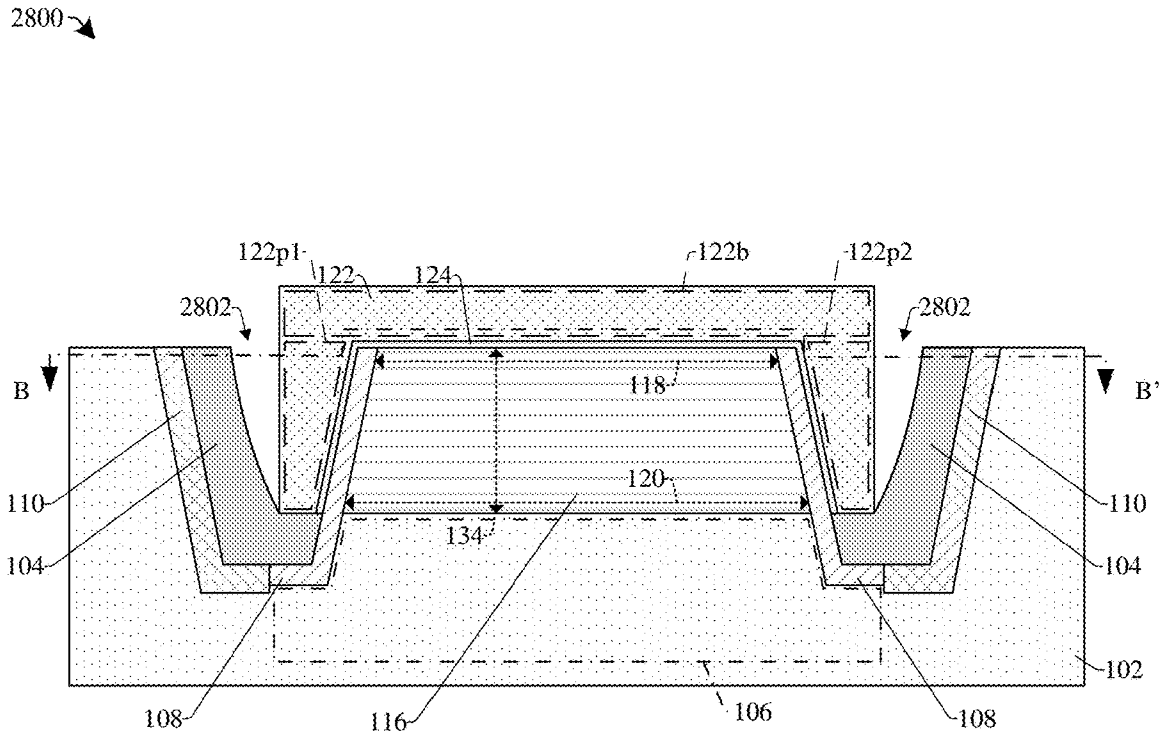
Figure 29:
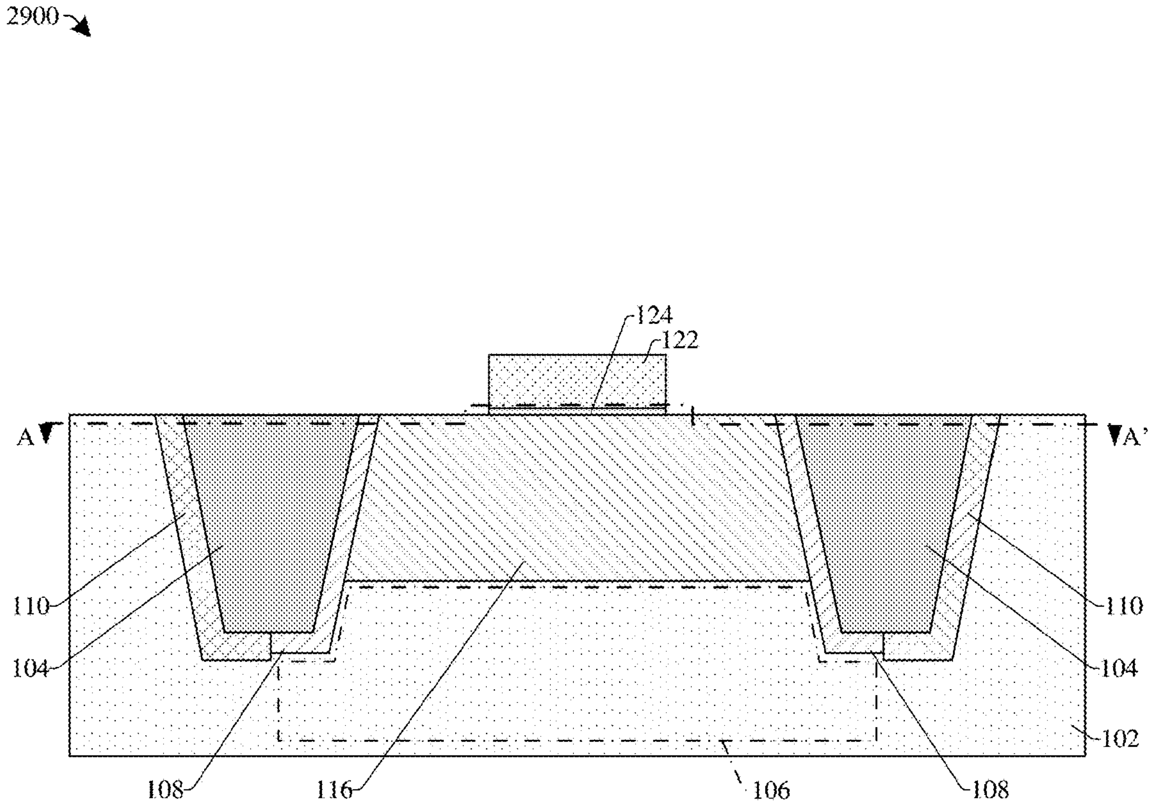

As shown in cross-sectional view 2800 of FIG. 28 and cross-sectional view 2900 of FIG. 29, a gate dielectric 124 and a gate electrode 122 are formed over the doped region 116 and within the gate opening 2602 of FIGS. 26-27. Cross-sectional view 2900 shows the first direction and cross-sectional view 2800 shows the second direction. The mask 2604 of FIGS. 26-27 is removed through an appropriate removal process. Subsequently, a gate dielectric 124 is formed over the doped region 116. The gate dielectric 124 can, for example, be formed by a selective deposition process (e.g., CVD, PVD, ALD, sputtering, etc. . . . ). In some embodiments, the gate dielectric 124 may, for example, be or comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like.

In the second direction, the gate dielectric 124 is deposited on the top surface of the doped region 116 and continuously extends along a top surface and sidewalls of the first doped liner 108 to the common bottom surface. As such, a bottom surface of the gate dielectric 124 is substantially level with the common bottom surface. In the second direction A-A', the gate dielectric 124 is formed above an interior surface of the doped region 116.

The gate electrode 122 is formed over the gate dielectric 124. The gate electrode 122 can, for example, be formed by a selective deposition process (e.g., CVD, PVD, ALD, sputtering, etc. . . . ). In some embodiments, the gate electrode 122 may, for example, be or comprise polysilicon or a metal, such as aluminum (Al), copper (Cu), titanium (Ti), tantalum (Ta), tungsten (W), molybdenum (Mo), cobalt (Co), or the like. In the second direction, the gate electrode 122 is formed with a gate body **122*b* that laterally extends past outer edges of the doped region 116 and extends directly over the STI structure 104. In the second direction, the gate electrode 122 is further formed with a first gate protrusion 122*p*1 and a second gate protrusion 122*p*2. The first gate protrusion 122*p*1 and the second gate protrusion 122*p*2 are formed extending downward from outer edges of the gate body 122*b* and into the STI structure 104. A bottom surface of the first gate protrusion 122*p*1 and a bottom surface of the second gate protrusion 122*p*2 are formed substantially level with the common bottom surface. After forming the gate electrode 122, the first gate protrusion 122*p*1 and the second gate protrusion 122*p*2 are separated from STI structure 104 at the top surface of the STI structure 104 by a sidewall opening 2802. In the first direction, the gate electrode 122 is formed on the gate dielectric 124 with outer sidewalls substantially aligned with outer sidewalls of the gate dielectric 124**.

Figure 30:
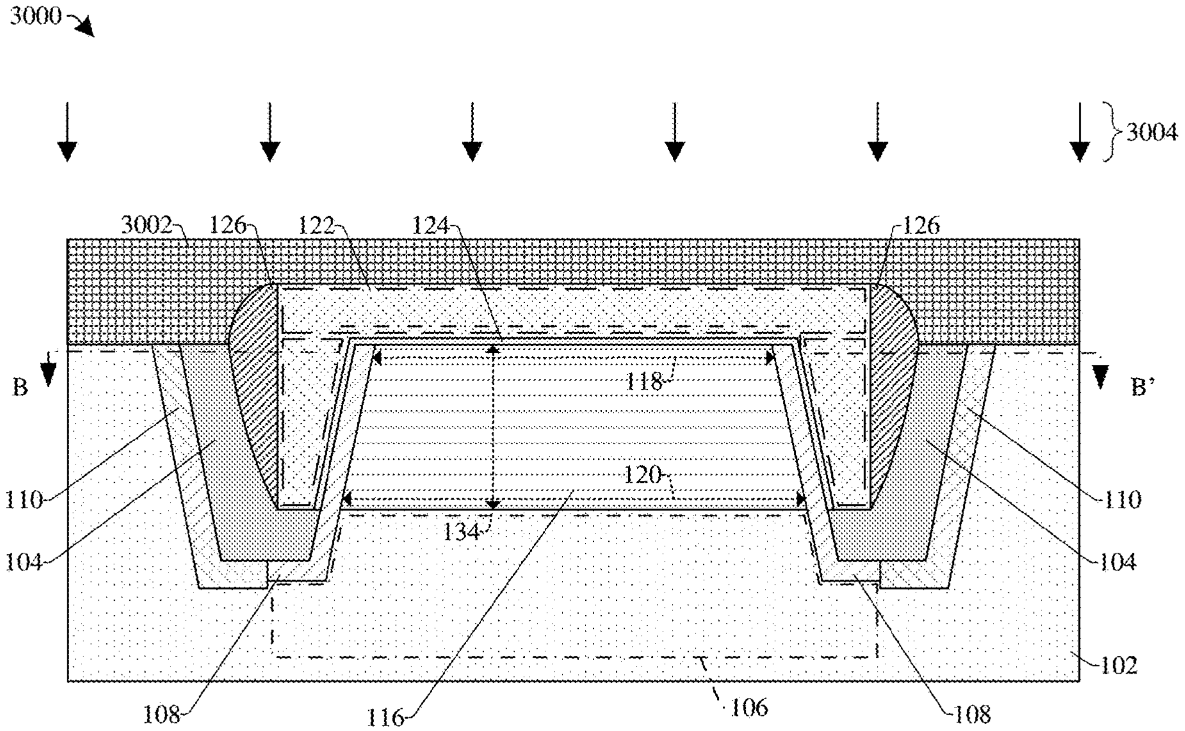
Figure 31:
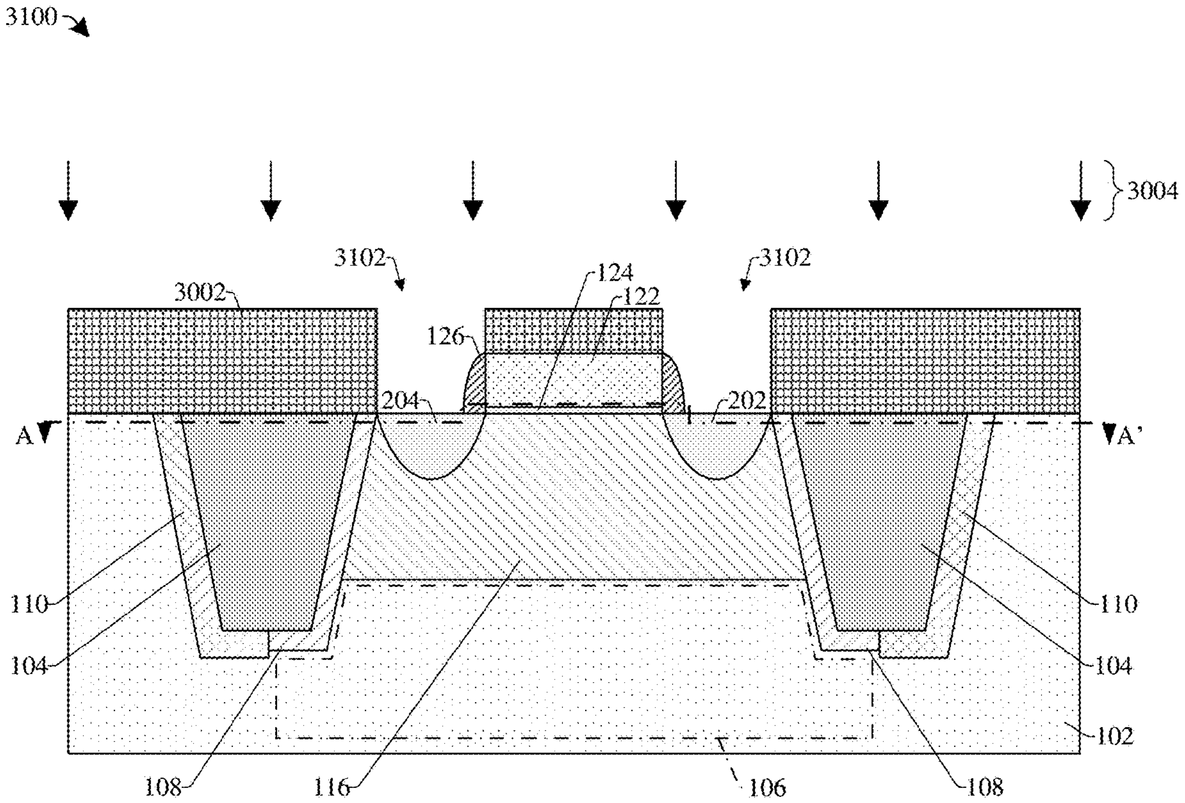

As shown in cross-sectional view 3000 of FIG. 30 and cross-sectional view 3100 of FIG. 31, a sidewall spacer 126 is formed on outer sidewalls of the gate electrode 122, a source region 202, and a drain region 204. Cross-sectional view 3100 shows the first direction and cross-sectional view 3000 shows the second direction. The sidewall spacer 126 is formed along outer edges of the gate electrode 122 from above the semiconductor substrate and protruding into the STI structure 104 in the second direction. As such, the sidewall spacer 126 is formed in the sidewall opening 2082 of FIG. 28. The sidewall spacer 126 is formed along outer sidewalls of the gate electrode 122 and the gate dielectric 124 in the first direction. The sidewall spacer 126 can, for example, be formed by a deposition process such as PVD, CVD, ALD, or the like, followed by an etch back process. In some embodiments, the sidewall spacer 126 may, for example, be or comprise a nitride, such as silicon nitride, or a high-k dielectric material, such as HfO, TaO, HfSiO, HfTaO, AlO, ZrO, or the like.

A fourth photoresist 3002 is formed to facilitate source region 202 and drain region 204 implantation. In the second direction, the fourth photoresist 3002 is formed over the substrate 102, the gate electrode 122, the sidewall spacer 126, the STI structure 104, and the second doped liner 110. In the first direction, the fourth photoresist 3002 is formed over the gate electrode 122, the first doped liner 108, the second doped liner 110, the substrate 102, and the STI structure 104. The fourth photoresist 3002 is patterned in the first direction forming opening 3102 exposing the doped region 116. Opening 3102 is exposed to a fifth doping process 3004, such as ion implantation, to form the source region 202 and the drain region 204. The source region 202 and the drain region 202 are formed between the gate electrode 122 and the first doped liner 108 within the doped region 116. In some embodiments, the source region 202 and the drain region 202 are formed with the first doping type. In some embodiments, the source region 202 and the drain region 202 are doped with a higher concentration than the doping concentration of the doped region 116. In some or similar embodiments, the source region 202 and the drain region 202 are formed with an n-type dopant to a concentration up to $1\times10^{20}$ impurities/$cm^3$.

Figure 32:
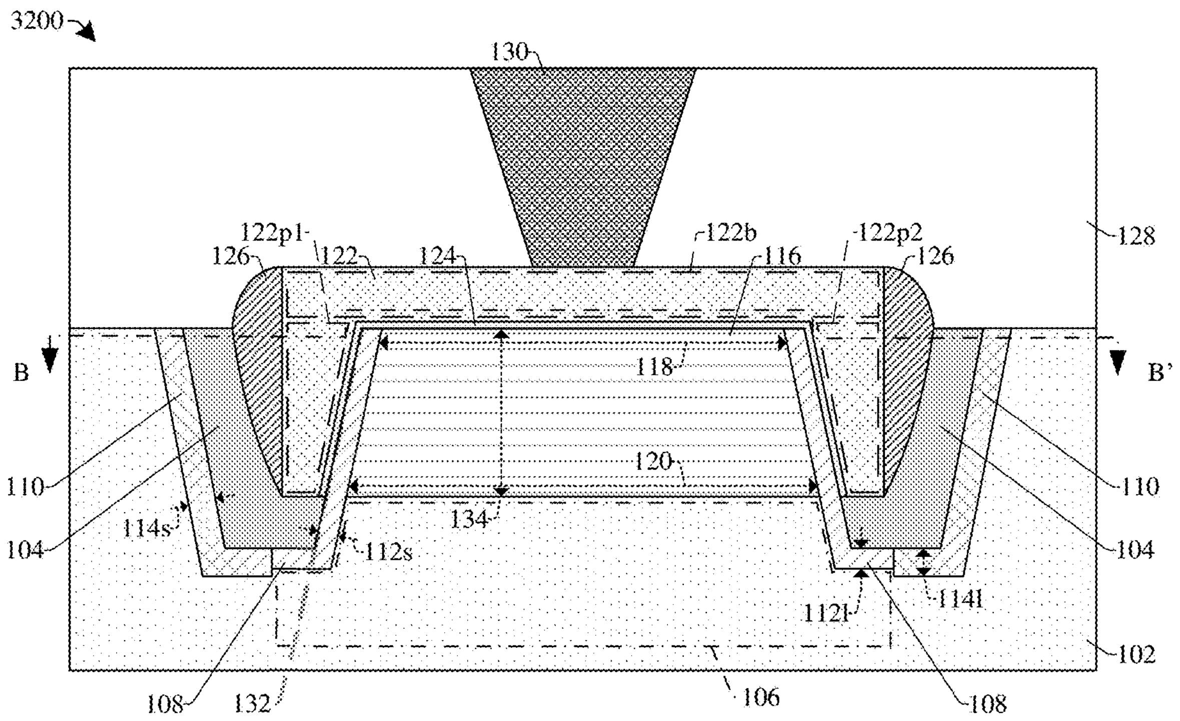
Figure 33:
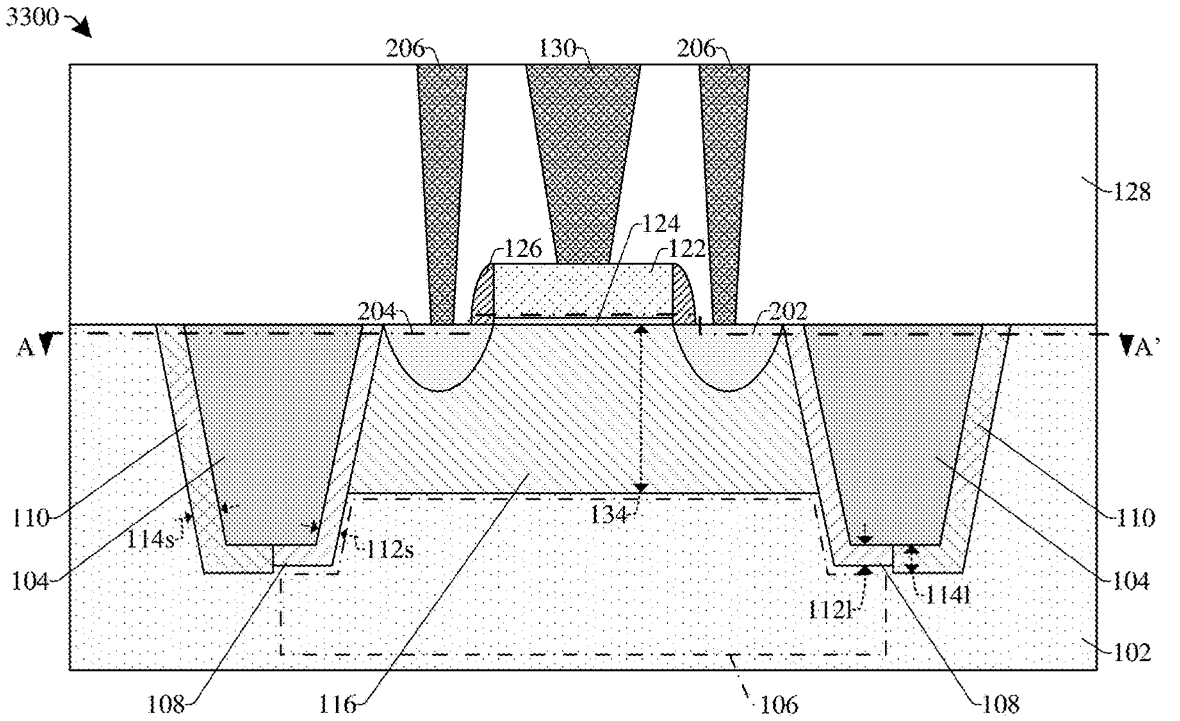

As shown in cross-sectional view 3200 of FIG. 32 and cross-sectional view 3300 of FIG. 33, dielectric layer 128 is formed and a gate electrode contact 130 and source/drain contacts 206 are formed through the dielectric layer 128 to contact the gate electrode 122, source region 202, and drain region 204 respectively. Cross-sectional view 3300 shows the first direction and cross-sectional view 3200 shows the second direction. The fourth photoresist 3002 of FIGS. 30-31 is removed by an appropriate removal process. The dielectric layer 128 is formed over the gate electrode 122, the sidewall spacer 126, the source region 202, the drain region 204, the first doped liner 108, the second doped liner 110, the STI structure 104, and the substrate 102. The dielectric layer 128 may, for example, be formed by a deposition process such as PVD, CVD, ALD, or the like. The dielectric layer 128 may, for example, be or comprise low-k dielectric (e.g., a dielectric material with a dielectric constant less than about 3.9), an oxide (e.g., $SiO_2$), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

The dielectric layer 128 is patterned and the gate electrode contact 130 and source/drain contacts 206 are formed through the dielectric layer 128. The gate electrode contact 130 is formed electrically coupled to the gate electrode 122. The source/drain contacts 206 are formed electrically coupled to the source region 202 and the drain region 204. The gate electrode contact 130 and the source/drain contacts 206 may, for example, be or comprise W, Cu, Al, or the like.

Figure 34:
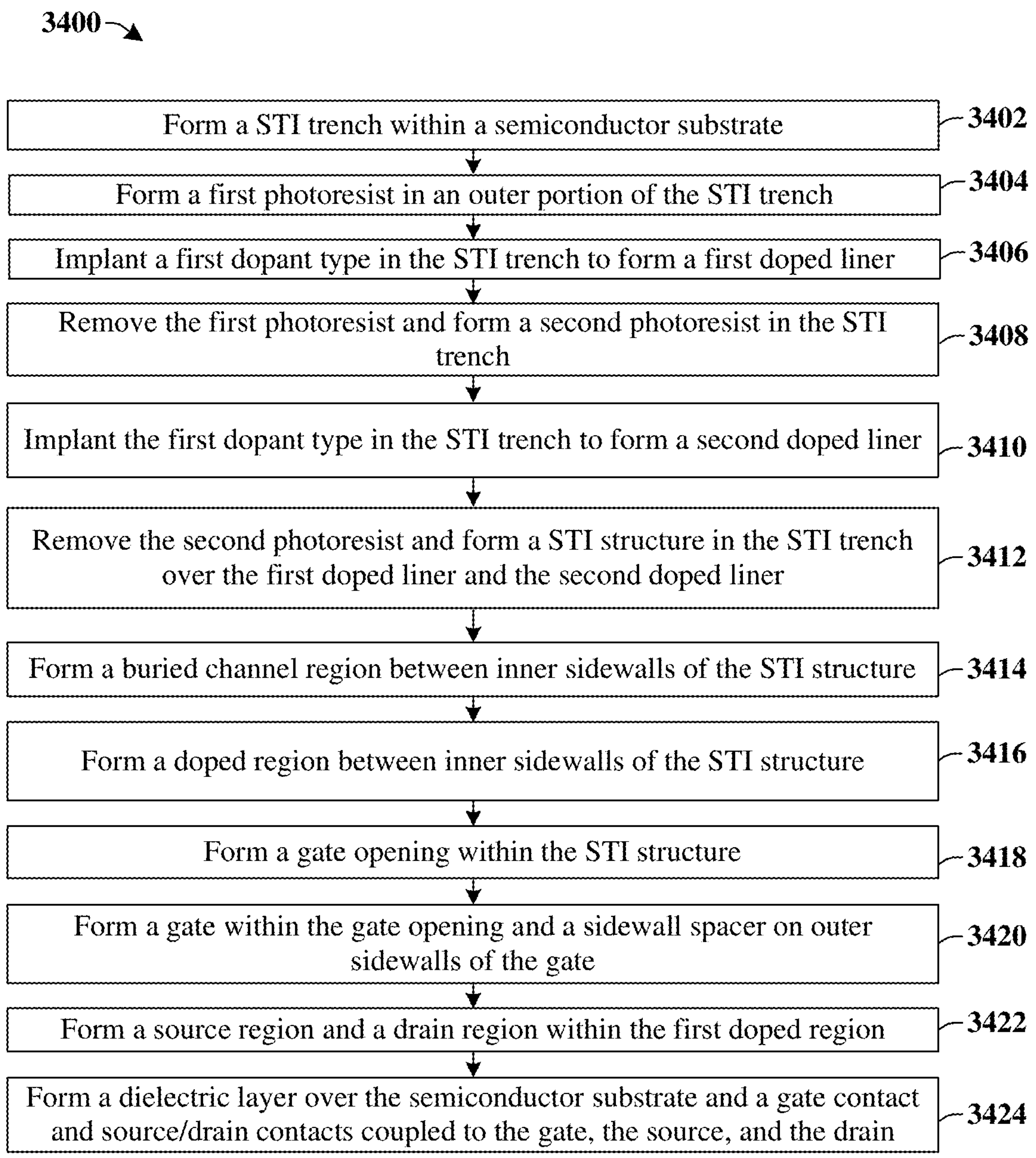
FIG. 34 illustrates a flow diagram of some embodiments of a method for forming a semiconductor device with a source, a drain, a gate, and a STI structure with a first doped liner and a second doped liner.

FIG. 34 illustrates a flow diagram of some embodiments 3400 of the method of FIGS. 10-33. While FIG. 34 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 3402, a STI trench is formed within a substrate. FIGS. 10-11 illustrates cross-sectional views 1000-1100 of some embodiments corresponding to act 3402.

At 3404, a first photoresist is formed in an outer portion of the STI trench and over the substrate. FIGS. 12-13 illustrate cross-sectional views 1200-1300 of some embodiments corresponding to act 3404.

At 3406, a second dopant type is implanted in the STI trench to form a first doped liner on an inner portion of the STI trench according to a first doping process. FIGS. 14-15 illustrate cross-sectional views 1400-1500 of some embodiments corresponding to act 3406.

At 3408, the first photoresist is removed and a second photoresist is formed in the STI trench covering the first doped liner. FIGS. 16-17 illustrate cross-sectional views 1600-1700 of some embodiments corresponding to act 3408.

At 3410, the second dopant type is implanted in the STI trench to form a second doped liner on an outer portion of the STI trench according to a second doping process, such that the second doped liner is formed with a greater thickness than the first doped liner. FIGS. 18-19 illustrate cross-sectional views 1800-1900 of some embodiments corresponding to act 3410.

At 3412, the second photoresist is removed and a STI structure is formed in the STI trench over the first doped liner and the second doped liner. FIGS. 20-23 illustrate cross-sectional views 2000-2300 of some embodiments corresponding to act 3412.

At 3414, a buried channel region is formed according to a third doping process with the second doping type within the substrate. A third photoresist is formed on the substrate and patterned and the substrate is exposed to the third doping process to form the buried channel region between inner sidewalls of the STI structure. FIGS. 22-23 illustrate cross-sectional views 2200-2300 of some embodiments corresponding to act 3414.

At 3416, a doped region is formed between inner sidewalls of the STI structure. The doped region is formed according to a fourth doping process and with a first doping type that is different than the second doping type. FIGS. 24-25 illustrate cross-sectional views 2400-2500 of some embodiments corresponding to act 3416.

At 3418, a mask is formed over the substrate with a gate opening formed through the mask and within the STI structure. FIGS. 26-27 illustrate cross-sectional views 2600-2700 of some embodiments corresponding to act 3418.

At 3420, a gate electrode is formed within the gate opening where the gate electrode is formed with protrusions separated by the doped region, and where the protrusions are connected by a gate body and the protrusions are a first gate protrusion and a second gate protrusion. The gate body is formed over the doped region. Furthermore, a sidewall spacer is formed on outer edges of the gate and protrude into the STI structure in a second direction. FIGS. 28-29 illustrate cross-sectional views 2800-2900 of some embodiments corresponding to act 3420.

At 3422, a fourth photoresist is formed and the fourth photoresist is patterned between the gate and the STI structure over the doped region in a first direction that is perpendicular to the second direction. After forming openings in the fourth photoresist, exposing the openings to a fifth dopant that is the second dopant to form a source region and a drain region within the substrate. FIGS. 30-31 illustrate cross-sectional views 3000-3100 of some embodiments corresponding to act 3422.

At 3424, a dielectric layer is formed over the substrate and a gate electrode contact is formed through the dielectric layer coupled to the gate electrode and source/drain contacts are formed through the dielectric layer coupled to the source region and the drain region. FIGS. 32-33 illustrate cross-sectional views 3200-3300 of some embodiments corresponding to act 3424.

Accordingly, in some embodiments, the present disclosure relates to a method of forming a structure having a source region, a drain region, a gate electrode, a channel region, a buried channel region, and a STI structure surrounding the source region, drain region, gate electrode, doped region, and channel region, where the STI structure has a first doped liner and a second doped liner.

In various embodiments, the present application provides a transistor including a shallow trench isolation (STI) structure laterally surrounding an active area in the substrate. A source region and a drain region are within the active area, and the source region and the drain region are spaced apart from one another and disposed along a line. A doped region is disposed on the line within the active area and between the source region and the drain region. A gate electrode comprises a gate body disposed above the doped region, and a first gate protrusion and a second gate protrusion extend downward from outer edges of the gate body to laterally flank the doped region. The first gate protrusion and the second gate protrusion have nearest neighboring inner sidewalls that extend in parallel with the line. A first doped liner is disposed along inner sidewalls and a bottom surface of the STI structure, where the first doped liner separates the first gate protrusion and the second gate protrusion from the doped region. A second doped liner is disposed along outer sidewalls and the bottom surface of the STI structure.

In various embodiments, the present application provides a semiconductor device including a substrate and a doped region disposed within the substrate. A gate electrode is disposed over the doped region, and a source region and a drain region are disposed within the doped region. A shallow trench isolation (STI) structure is disposed within the substrate and laterally surrounds the source region and the drain region. A first doped liner is disposed along the STI structure, where the first doped liner separates the STI structure from the source region and the drain region. A second doped liner is disposed along the STI structure, where the second doped liner is separated from the first doped liner by the STI structure above a bottom surface of the STI structure.

In various embodiments, the present application provides a method of forming a semiconductor structure, including forming a shallow trench isolation (STI) trench within a substrate and forming a first photoresist on an outer portion of the STI trench. A dopant type is implanted into the STI trench forming a first doped liner on an inner portion of the STI trench. The first photoresist is removed and a second photoresist is formed in the STI trench covering the first doped liner. The dopant type is further implanted into the STI trench forming a second doped liner on the outer portion of the STI trench; where the second doped liner is formed with a greater thickness than the first doped liner. The second photoresist is removed and a STI structure is formed in the STI trench over the first doped liner and the second doped liner. A doped region is formed between inner sidewalls of the STI structure and a gate opening is formed within the STI structure. A gate electrode is formed within the gate opening, where the gate electrode is formed with a first gate protrusion and a second gate protrusion separated by the doped region. The first gate protrusion and the second gate protrusion are connected by a gate body of the gate electrode formed above the doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
- forming a shallow trench isolation (STI) trench within a substrate;
- forming a first photoresist on an outer portion of the STI trench;
- implanting a dopant type into the STI trench forming a first doped liner on an inner portion of the STI trench;
- removing the first photoresist;
- forming a second photoresist in the STI trench covering the first doped liner;
- implanting the dopant type into the STI trench forming a second doped liner on the outer portion of the STI trench; wherein the second doped liner is formed with a different thickness than the first doped liner;
- removing the second photoresist;
- forming a STI structure in the STI trench over the first doped liner and the second doped liner;
- forming a doped region between inner sidewalls of the STI structure;
- forming a gate opening within the STI structure; and
- forming a gate electrode within the gate opening, wherein the gate electrode is formed with a first gate protrusion and a second gate protrusion separated by the doped region; and wherein the first gate protrusion and the second gate protrusion are connected by a gate body of the gate electrode formed above the doped region.

2. The method of claim 1, wherein the doped region is formed with a dopant type of the doped region that is different from the dopant type of the first doped liner and the second doped liner.

3. The method of claim 1, wherein the second doped liner is formed with a doping concentration that is higher than a doping concentration of the first doped liner.

4. The method of claim 1, wherein the doped region is formed with a height below the substrate; and
- the gate opening is formed extending to the height below the substrate.

5. The method of claim 4, wherein the first and second gate protrusions are formed laterally surrounded by the first doped liner and the STI structure.

6. The method of claim 1, further comprising:
- forming a sidewall opening within the STI structure, wherein the sidewall opening exposes outer sidewalls of the gate electrode and extends to a bottom surface of the first and second gate protrusions; and forming a sidewall spacer in the sidewall opening, wherein the sidewall spacer is formed along outer sidewalls of the gate electrode and sidewalls of the STI structure, wherein the sidewall spacer extends from the bottom surface of the first and second gate protrusions to a top surface of the gate electrode.

7. The method of claim 1, further comprising:

forming a gate dielectric within the gate opening and over a top surface of the doped region, wherein a bottom surface of the gate dielectric is substantially level with a bottom surface of the doped region; and forming the gate electrode within the gate opening wherein the first and second gate protrusions are formed between the STI structure and the gate dielectric, and the gate body of the gate electrode is formed on a top surface of the gate dielectric.

8. A method of forming a transistor comprising:

forming a shallow trench isolation (STI) trench within a substrate;

forming a first doped liner on the substrate exposed within the STI trench, and laterally surrounding an area in the substrate, wherein the first doped liner is formed in a first portion of the STI trench including a first vertically extending sidewall of the STI trench and a first portion of a bottom surface of the STI trench;

forming a second doped liner on the substrate exposed within the STI trench, wherein the second doped liner extends from the first doped liner in a direction away from the area in the substrate, and wherein the second doped liner is formed in a second portion of the STI trench opposite the first portion of the STI trench, including a second vertically extending sidewall of the STI trench opposite the first vertically extending sidewall of the STI trench, and a second portion of the bottom surface of the STI trench that is adjacent to the first portion of the bottom surface of the STI trench;

forming a shallow trench isolation (STI) structure between the first and second doped liners, where outer sidewalls and a bottom surface of the STI structure are formed on the second doped liner, and inner sidewalls that extend in a vertical direction and the bottom surface of the STI structure are formed on the first doped liner;

forming a source region and a drain region within the area, the source region and the drain region formed spaced apart from one another and disposed along a line;

forming a doped region within the area and between the source region and the drain region; and forming a gate electrode comprising a gate body disposed above the doped region, wherein the gate electrode is formed with a first gate protrusion and a second gate protrusion that extend downward from outer edges of the gate body to laterally flank the doped region, the first gate protrusion and the second gate protrusion formed with nearest neighboring inner sidewalls that substantially extend in parallel with the line, wherein the first doped liner separates the first and second gate protrusions from the doped region.

9. The method of claim 8, wherein the first doped liner is formed with a first thickness and the second doped liner is formed with a second thickness that is different from the first thickness of the first doped liner.

10. The method of claim 8, wherein a bottom surface of the first gate protrusion and the second gate protrusion are formed extending to a bottom surface of the doped region.

11. The method of claim 8, wherein the doped region is formed with a top width and a bottom width, wherein a ratio of the bottom width to the top width is less than 2.

12. The method of claim 8, wherein inner surfaces of the STI structure facing the doped region are formed with a constant slope.

13. The method of claim 8, wherein the STI structure is formed extending past a bottom surface of the gate electrode, and below the doped region.

14. The method of claim 8, further comprising:

forming a sidewall spacer disposed along outer edges of the first and second gate protrusions, wherein the sidewall spacer is formed extending into the STI structure and separating the outer edges of the first and second gate protrusions from the STI structure.

15. The method of claim 14, wherein the first doped liner and the second doped liner are formed abutting at an interface on the bottom surface of the STI structure directly below the sidewall spacer.

16. A method of forming a semiconductor device, the method comprising:

forming a shallow trench isolation (STI) trench within a substrate;

forming a first doped liner within a first portion of the STI trench according to a first doping process, wherein outer sidewalls of the first doped liner are formed contacting the substrate;

forming a second doped liner within a second portion of the STI trench according to a second doping process, the second portion being laterally offset from the first portion, wherein outer sidewalls of the second doped liner are formed contacting the substrate;

forming a shallow trench isolation (STI) structure within the substrate extending from a vertically extending sidewall of the first doped liner to a vertically extending sidewall of the second doped liner;

forming a doped region within the substrate between inner sidewalls of the first doped liner; and forming a source region and a drain region within the doped region, wherein the first doped liner separates the STI structure from the source region and the drain region.

17. The method of claim 16, wherein the second doped liner is formed extending past the first doped liner beneath the STI structure.

18. The method of claim 16, further comprising:

forming a buried channel region below the doped region.

19. The method of claim 18, wherein the first doped liner is formed extending from the doped region into the buried channel region.

20. The method of claim 18, wherein the source region, the drain region, and the doped region are formed with a first doping type; and the buried channel region, the first doped liner, and the second doped liner are formed with a second doping type, wherein the first doping type and the second doping type are different.

* * * * *